United States Patent
O'Brien et al.

(10) Patent No.: US 11,276,730 B2
(45) Date of Patent: Mar. 15, 2022

(54) SPIN ORBIT TORQUE MEMORY DEVICES AND METHODS OF FABRICATION

(71) Applicant: Intel Corporation, Santa Clara, CA (US)

(72) Inventors: Kevin O'Brien, Portland, OR (US); Christopher Wiegand, Portland, OR (US); Tofizur Rahman, Portland, OR (US); Noriyuki Sato, Hillsboro, OR (US); Gary Allen, Portland, OR (US); James Pellegren, Portland, OR (US); Angeline Smith, Hillsboro, OR (US); Tanay Gosavi, Hillsboro, OR (US); Sasikanth Manipatruni, Portland, OR (US); Kaan Oguz, Portland, OR (US); Benjamin Buford, Hillsboro, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/246,360

(22) Filed: Jan. 11, 2019

(65) Prior Publication Data

US 2020/0227474 A1    Jul. 16, 2020

(51) Int. Cl.
| | | |
|---|---|---|
| *H01L 27/22* | (2006.01) | |
| *H01L 43/04* | (2006.01) | |
| *H01L 43/14* | (2006.01) | |
| *H01L 43/08* | (2006.01) | |
| *H01L 43/10* | (2006.01) | |

(52) U.S. Cl.
CPC ............ *H01L 27/228* (2013.01); *H01L 43/04* (2013.01); *H01L 43/08* (2013.01); *H01L 43/10* (2013.01); *H01L 43/14* (2013.01)

(58) Field of Classification Search
CPC ..... H01L 27/228; H01L 43/00; H01L 27/222; H01L 43/04; H01L 43/14; H01L 43/08; H01L 43/10
See application file for complete search history.

(56) References Cited

U.S. PATENT DOCUMENTS

| | | | |
|---|---|---|---|
| 2010/0091555 A1* | 4/2010 | Fukami .................. | B82Y 10/00 365/158 |
| 2015/0041934 A1* | 2/2015 | Khvalkovskiy .......... | G11C 11/18 257/421 |
| 2015/0171316 A1* | 6/2015 | Park ........................ | H01L 43/12 257/421 |
| 2016/0042778 A1* | 2/2016 | Manipatruni ........... | G11C 11/18 365/66 |

(Continued)

OTHER PUBLICATIONS

Van den Brink et al., Spin-Hall-assisted magnetic random access memory, Applied Physics Letters 104, 012403 (2014) (Year: 2014).*

(Continued)

*Primary Examiner* — Shih Tsun A Chou
(74) *Attorney, Agent, or Firm* — Essential Patents Group, LLP

(57) ABSTRACT

A perpendicular spin orbit memory device includes a first electrode having a magnetic material and platinum and a material layer stack on a portion of the first electrode. The material layer stack includes a free magnet, a fixed magnet above the first electrode, a tunnel barrier between the free magnet and the fixed magnet and a second electrode coupled with the fixed magnet.

17 Claims, 13 Drawing Sheets

(56) References Cited

U.S. PATENT DOCUMENTS

| | | |
|---|---|---|
| 2017/0076769 A1* | 3/2017 | Shirotori ............... G11C 11/161 |
| 2018/0130943 A1* | 5/2018 | Naik ................... H01F 10/3254 |
| 2018/0351085 A1* | 12/2018 | Shiokawa ............... H01L 43/04 |
| 2019/0288031 A1* | 9/2019 | Satoh .................. G11C 11/1675 |
| 2019/0363244 A1* | 11/2019 | Sasaki ................ H01F 10/3272 |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0278403 A1* | 9/2020 | Shiokawa ............... H01L 43/04 |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

OTHER PUBLICATIONS

Ling et al., University Physics vol. 2, OpenStax, Rice University, 2018 (Year: 2018).*

Kimura et al., Room-Temperature Reversible Spin Hall Effect, Physical Review Letters, PRL 98, 156601 (2007) (Year: 2007).*

* cited by examiner

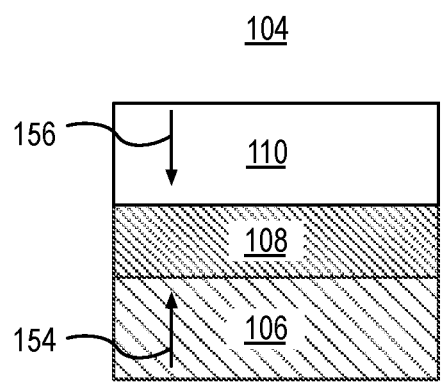
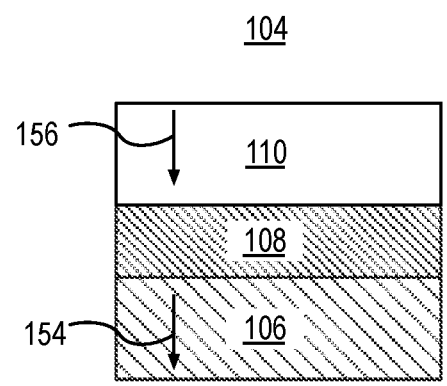
FIG. 1E               FIG. 1F
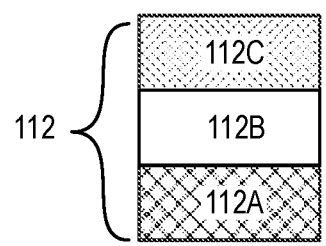
FIG. 1G

SPIN ORBIT TORQUE MEMORY DEVICES AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit memory devices including a spin orbit electrode coupled with a compatible Magnetic Tunnel Junction (MTJ) device to overcome the requirements imposed by scaling.

Non-volatile embedded memory with spin orbit memory devices, e.g., on-chip embedded memory with non-volatility can enable energy and computational efficiency. However, the technical challenges of assembling a material layer stack to form functional spin orbit memory devices present formidable roadblocks to commercialization of this technology today. Specifically, increasing switching efficiency in a spin orbit memory device is an important area of device development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1E illustrates a cross-sectional view depicting the direction of magnetization in a free magnet relative to the direction of magnetization in a fixed magnetic layer, in accordance with an embodiment of the present disclosure.

FIG. 1F illustrates a cross-sectional view depicting the direction of magnetization in a free magnet relative to the direction of magnetization in a fixed magnetic layer, in accordance with an embodiment of the present disclosure.

FIG. 1G illustrates a cross-sectional view of individual layers of a synthetic antiferromagnetic structure, in accordance with an embodiment of the present disclosure.

DESCRIPTION OF THE EMBODIMENTS

Figure 1A:
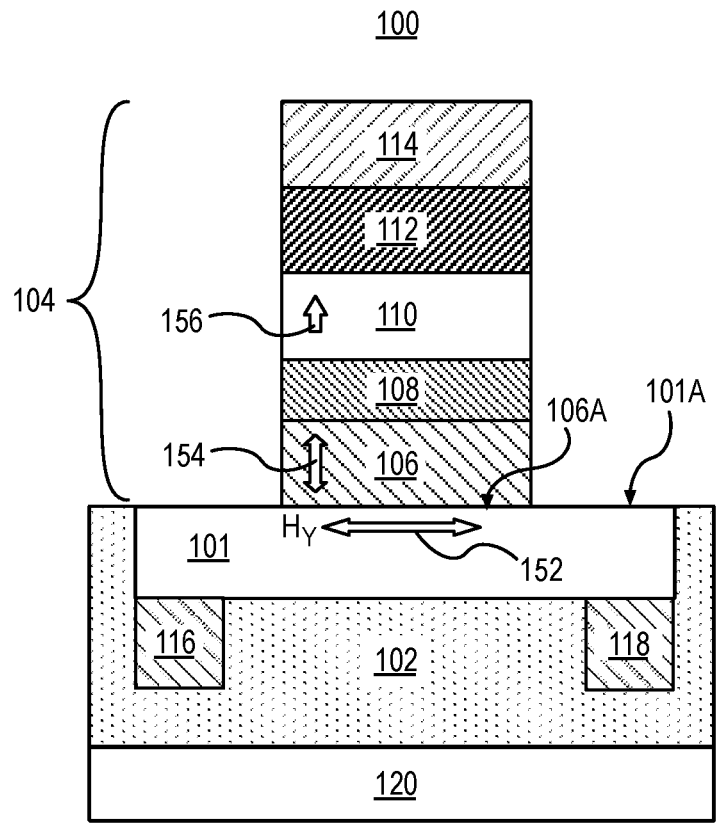
FIG. 1A illustrates a cross-sectional view of a spin orbit memory device with a spin orbit electrode including a magnetic material and a metal, in accordance with an embodiment of the present disclosure.

Spin orbit memory devices with enhanced spin orbit coupling and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque,).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +1-10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

A spin orbit memory device may include a magnetic tunnel junction (MTJ) device formed on an electrode including a spin orbit material, herein a spin orbit electrode. The MTJ device functions as a memory device where the resistance of the MTJ device switches between a high resistance state and a low resistance state. The resistance state of an MTJ device is defined by the relative orientation of magnetization between a free magnet and a fixed magnet that are separated by a tunnel barrier. When the magnetization of the free magnet and a fixed magnet have orientations that are in the same direction, the MTJ device is said to be in a low resistance state. Conversely, when the magnetization of the free magnet and a fixed magnet each have orientations that are in opposite direction to each other, the MTJ device is said to be in a high resistance state.

As MTJ devices are scaled, the need for smaller memory elements to fit into a scaled cell size has driven the industry in the direction of perpendicular MTJ (pMTJ). pMTJ based memory devices have a fixed magnet and a free magnet each having a magnetic anisotropy that is perpendicular with respect to a plane of the free magnet. Resistance switching is brought about in a pMTJ device by passing a critical amount of spin polarized current through the pMTJ device so as to influence the orientation of the magnetization of the free magnet to align with the magnetization of the fixed magnet. The act of influencing the magnetization is brought about by a phenomenon known as spin torque transfer, where the torque from the spin polarized current is imparted to the magnetization of the free magnet. By changing the direction of the current, the direction of magnetization in the free magnet may be reversed relative to the direction of magnetization in the fixed magnet. Since the free magnet does not need a constant source of spin polarized current to maintain a magnetization direction, the resistance state of the pMTJ device is retained even when there is no current flowing through the pMTJ device. For this reason, the MTJ device belongs to a class of memory known as non-volatile memory.

As a pMTJ device is further scaled down in size, the amount of critical spin polarized current density required to switch the device increases. By implementing an MTJ device on a spin orbit electrode, the magnetization in the free magnet can switch with a torque provided by a spin Hall current, induced by passing an electrical current in a transverse direction, through the spin orbit electrode. The spin Hall current arises from spin dependent scattering of electrons due to a phenomenon known as spin orbit interaction.

Electrons of one spin polarity are directed towards an upper portion of the spin orbit electrode and electrons with an opposite spin polarity are directed toward a bottom portion of the spin orbit electrode. Electrons of a particular spin polarity are diffused toward the free magnet of the pMTJ device and impart a spin orbit torque on the magnetization of the free magnet. The spin hall current can also help the pMTJ device to switch faster. It is to be appreciated that, in an embodiment, the spin hall current can switch a free magnet having a magnetization that is oriented in an in-plane direction, even in the absence of a spin polarized current passing through the pMTJ device. An in-plane direction is defined as a direction that is parallel to an uppermost surface of the spin orbit electrode. To fully utilize the effect of a spin Hall current and spin torque transfer current, an external magnetic field may be required to provide an-plane symmetry breaking component. The external magnetic field may be applied in a direction parallel to the plane of the spin orbit electrode layer. However, by implementing a pMTJ device on a spin orbit electrode with a ferromagnetic material having an intrinsic in-plane exchange bias, an in-plane symmetry breaking component may be introduced. Such an intrinsic in-plane exchange bias in the spin orbit electrode may efficiently switch the free magnet in the pMTJ device without having to introduce an external field.

In accordance with embodiments of the present disclosure, a spin orbit memory device includes a first electrode having a magnetic material and spin orbit coupling material such as platinum, where the magnetic material has an in-plane magnetization. The in-plane magnetization has a direction that is parallel to a top surface of the first electrode. The memory device further includes a material layer stack for a magnetic junction device. In an embodiment, the magnetic junction device is a magnetic tunnel junction (MTJ) device. The MTJ device includes a first magnet with a second magnetization, where the second magnetization is orthogonal to the first magnetization. The MTJ device further includes a second magnet with a third magnetization, where the second magnet is above the first magnet and a layer including oxygen and a metal between the first magnet and the second magnet and a second electrode coupled with the second magnet. The first magnet is a free magnet, having a second magnetization that is in-plane in one example. In another example, the first magnet is a free magnet having a second magnetization perpendicular (or orthogonal to an in-plane direction) in other example. The second magnet is a fixed magnet and has a third magnetization that is perpendicular.

Additionally, in some embodiments, the memory device also includes a non-magnetic metal layer between the spin orbit electrode and the first magnet. The non-magnetic metal layer may include a metal such as tungsten or molybdenum. A non-magnetic metal layer including a metal such as tungsten or molybdenum may prevent diffusion of elemental iron from a free magnet in contact with the spin orbit electrode and help preserve properties of the pMTJ device such as tunneling magnetoresistance ratio and switching speed.

FIG. 1A is an illustration of a cross-sectional view of a spin orbit memory device 100 in accordance with an embodiment of the present disclosure. The spin orbit memory device 100 includes an electrode 101 having a magnetic material and spin orbit coupling material such as platinum, where the magnetic material has an in-plane magnetization 152 (denoted by the bi-directional arrow), along the Y-direction. The electrode 101 is herein referred to as a spin orbit electrode 101. In-plane magnetization 152, along the Y-direction gives rise to an intrinsic in-plane magnetic field, Hy, as shown. In-plane magnetization 152 has a direction that is parallel to a top surface 101A of the spin orbit electrode 101. The spin orbit memory device 100 further includes a material layer stack for a magnetic junction device 104. In the illustrative embodiment, the magnetic junction device 104 is a perpendicular magnetic tunnel junction (pMTJ) device 104. In an embodiment, the pMTJ device 104 includes a magnet 106 having a magnetization 154 that is orthogonal to the magnetization 152 of the spin orbit electrode 101. The magnet 106 has a magnetization 154 that may orient in the positive or negative Z-direction (as indicated by the bi-directional arrow). Such a magnet 106 is herein referred to as a free magnet 106. The MTJ device 104 further includes a second magnet 110 above the first magnet where the magnet 110 has a third magnetization (denoted by arrow 156). The magnet 110 has a magnetization 156 that is also orthogonal to the magnetization 152 of the spin orbit electrode 101. In the illustrative embodiment, the magnet 110 has a magnetization 156 along a positive Z direction that is fixed. Such a magnet 110 is herein referred to as a fixed magnet 110. The pMTJ device 104 includes a tunnel barrier 108 including oxygen and a metal such as magnesium, between the free magnet 106 and the fixed magnet 110. The pMTJ device 104 includes a second electrode 114 above the fixed magnet 110.

In an embodiment, spin orbit electrode 101 includes a magnetic material such as cobalt or iron or a combination thereof. In an embodiment, the spin orbit electrode 101 includes at least 50% platinum. A spin orbit electrode 101 having a platinum concentration of at least 50% has a high spin Hall efficiency. When a charge current is passed through the spin orbit electrode 101, having a high spin hall efficiency, a large spin Hall current is generated in a direction transverse to the charge current. A large spin Hall current can provide a spin polarized current component to the free magnet 106. A spin Hall current induced spin polarized current can provide additional spin-transfer torque and influence the magnetization of the free magnet 106 for faster switching. In an embodiment, the spin orbit electrode 101 has a thickness between 2 nm and 10 nm.

Figure 1B:
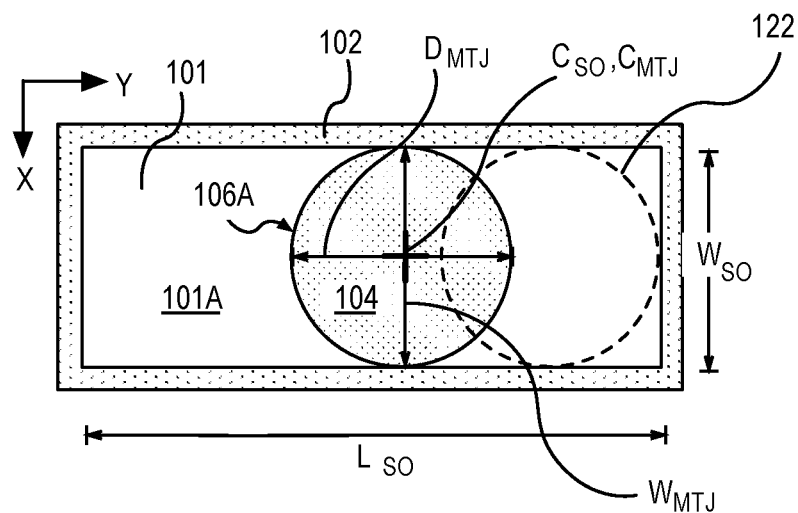
FIG. 1B illustrates a plan view of a magnetic tunnel junction (MTJ) device on a spin orbit electrode, in accordance with an embodiment of the present disclosure.

In an embodiment, the top surface 101A of the spin orbit electrode 101 has a rectangular plan view profile as illustrated in FIG. 1B. In some such embodiments, the top surface 101A of the spin orbit electrode 101 has a length, $L_{SO}$. As shown, the pMTJ device 104 has a circular plan view profile. In some such embodiments, the bottom surface 106A has a diameter, $D_{MTJ}$. In an embodiment, $L_{SO}$ is at least three times greater than $D_{MTJ}$. In an embodiment, the spin orbit electrode 101 has a length, $L_{SO}$, between 50 nm and 500 nm. In an embodiment, $D_{MTJ}$ is between 10 nm and 50 nm. In other embodiments, the pMTJ device 104 has a plan view profile that is rectangular or elliptical.

In the illustrative embodiment, the spin orbit electrode 101 has a width, $W_{SO}$, along the X-direction in FIG. 1B. In some embodiments, $W_{SO}$, is between 10 nm and 50 nm. In an embodiment, the pMTJ device 104 has a broadest cross-sectional width, $W_{MTJ}$, along the direction of the width, $W_{SO}$ of the pMTJ that is similar or substantially similar to the width, $W_{SO}$. In an embodiment, the pMTJ device 104 has a broadest cross-sectional width, $W_{MTJ}$, that is between 10 nm and 50 nm.

In an embodiment, the pMTJ device 104 has a center, $C_{MTJ}$ and the electrode 101 has a center, $C_{SO}$, as illustrated in the plan view illustration of FIG. 1B. In an embodiment, $C_{MTJ}$ is aligned to $C_{SO}$ in X and Y directions, as illustrated. In another embodiment, $C_{MTJ}$ is misaligned from the $C_{SO}$ in the Y-direction. An example of a pMTJ device 104 that is misaligned is indicated by dashed lines 122. Misalignment may range between 10 nm and 30 nm in X and/or Y directions. The electrical resistivity of the spin orbit electrode 101 may play a role in positioning of the pMTJ device 104 on the spin orbit electrode 101 along the Y-direction in FIG. 1B. When a pMTJ device 104 that is misaligned portions of it may extend over a dielectric material 102 surrounding the spin orbit electrode 101.

Figure 1C:
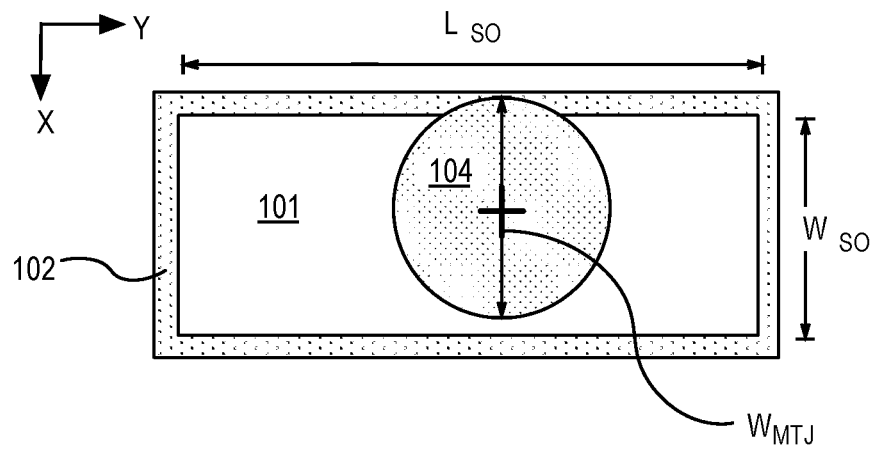
FIG. 1C illustrates a plan view of a magnetic tunnel junction (MTJ) device having a center that is misaligned with an axis of a spin orbit torque (SOT) electrode, in accordance with an embodiment of the present disclosure.

In other embodiments, the pMTJ device 104 has a broadest cross-sectional width, $W_{MTJ}$, that is similar or substantially similar to the width, $W_{SO}$, but a portion of the pMTJ device 104 extends partially over the dielectric material 102 as illustrated in FIG. 1C. Misalignment may occur during a fabrication process.

Figure 1D:
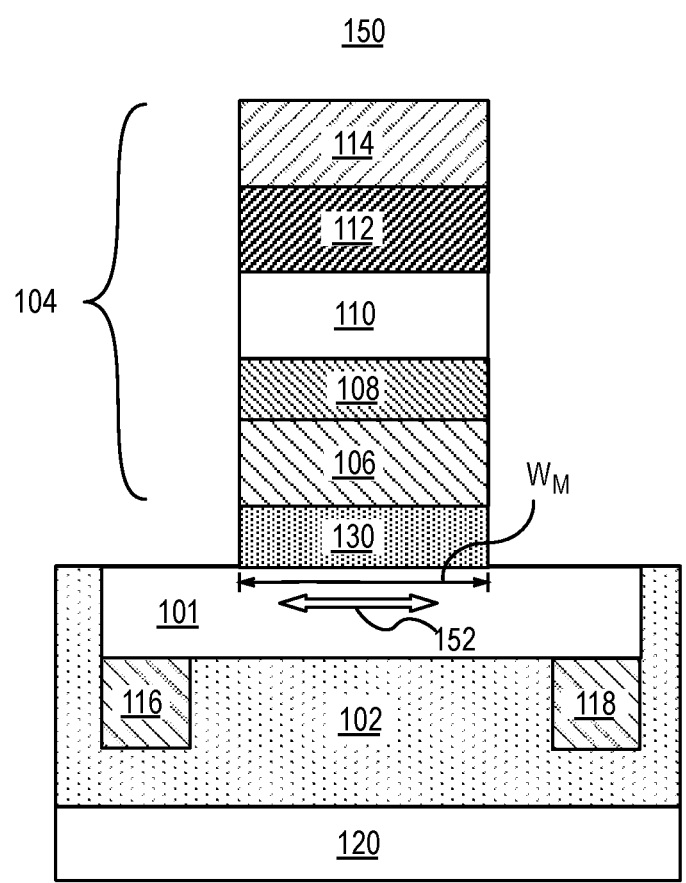
FIG. 1D illustrates a cross-sectional view of a spin orbit memory device with a spin orbit electrode including a magnetic material and a layer of metal between the free magnet and the spin orbit electrode, in accordance with an embodiment of the present disclosure.

In another embodiment, a spin orbit memory device 100 may include an additional conductive layer between the spin orbit electrode 101 and the free magnet 106 to improve a perpendicular magnetic anisotropy of the pMTJ device and promote even greater switching efficiency. Such a memory device 150 is illustrated in FIG. 1D. Memory device 150 includes a layer 130 between the pMTJ device 104 and the spin orbit electrode 101. In an embodiment, the layer 130 includes tungsten or molybdenum. In some examples, the layer 130 including tungsten or molybdenum has a thickness between 0.2 nm and 1 nm. A 0.2 nm layer of tungsten or molybdenum may be partially discontinuous along the width, $W_M$, of the pMTJ device 104.

Referring again to FIG. 1A, in an embodiment, the free magnet 106 includes a magnetic material such as Co, Ni, Fe or alloys of these materials. In an embodiment, the free magnet 106 includes a magnetic material such as CoB, FeB, CoFe or CoFeB. In some embodiments, the free magnet 106 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 106 is FeB, where the concentration of boron is between 10 and 40 atomic percent of the total composition of the FeB alloy. In an embodiment, the free magnet 106 includes a magnetic material such as Co, Ni, Fe or alloys of these materials. In an embodiment, the free magnet 106 includes a magnetic material such as CoB, FeB, CoFe or CoFeB. In some embodiments, the free magnet 106 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 106 is FeB, where the concentration of boron is between 10 and 40 atomic percent of the total composition of the FeB alloy. In an embodiment, the free magnet 106 and the free magnet 106 include $Co_{100-x-y}Fe_xB_y$, where X and Y each represent atomic percent, further where X is between 50 and 80 and Y is between 10 and 40, and further where the sum of X and Y is less than 100. In one example, the free magnet 106 may have a thickness between 0.5 nm and 2.0 nm for pMTJ devices.

In an embodiment, tunnel barrier 108 includes a material suitable for allowing electron current having a majority spin to pass through tunnel barrier 108, while impeding, at least to some extent, electron current having a minority spin from passing through tunnel barrier 108. Thus, tunnel barrier 108 (or spin filter layer) may also be referred to as a tunneling layer for electron current of a particular spin orientation. In an embodiment, tunnel barrier 108 includes a material such as, but not limited to, oxygen and at least one of magnesium (e.g., a magnesium oxide, or MgO), or aluminum (e.g., an aluminum oxide such as $Al_2O_3$). In an embodiment, tunnel barrier 108 including MgO has a crystal orientation that is (001) and is lattice matched to free magnet 106 below tunnel barrier 108 and fixed magnet 110 above tunnel barrier 108. In an embodiment, tunnel barrier 108 is MgO and has a thickness in the range of 1 nm to 3 nm. In an embodiment, a free magnet 106 including a $Co_{100-x-y}Fe_xB_y$, is highly lattice matched to the tunnel barrier 108 including an MgO. Lattice matching between a crystal structure of the free magnet 106 and the tunnel barrier 108 enables a higher tunneling magnetoresistance (TMR) ratio in the pMTJ device 104.

In some embodiments, the fixed magnet 110 includes a material and has a thickness sufficient for maintaining a fixed magnetization. In an embodiment, the fixed magnet 110 of the pMTJ device 104 includes an alloy such as CoFe or CoFeB. In an embodiment, the fixed magnet 110 comprises a $Co_{100-x-y}Fe_xB_y$, where X and Y each represent atomic percent, further where X is between 50-80 and Y is between 10 and 40, and further where the sum of X and Y is less than 100. In one specific embodiment, X is 60 and Y is 20. In an embodiment, the fixed magnet 110 is FeB, where the concentration of boron is between 10 and 40 atomic percent of the total composition of the FeB alloy. In an embodiment the fixed magnet 110 has a thickness that is between 1 nm and 3 nm.

FIG. 1E illustrates a cross-sectional view depicting the free magnet 106 of the pMTJ device 104 having a direction of magnetization 154 (denoted by the direction of the arrow) that is anti-parallel to a direction of magnetization 156 (denoted by the direction of the arrow) in the fixed magnet 110. When the direction of magnetization 154 in the free magnet 106 is opposite (anti-parallel) to the direction of magnetization 156 in the fixed magnet 110, the pMTJ device 104 device is said to be in a high resistance state.

Conversely, FIG. 1F illustrates a cross-sectional view depicting the free magnet 106 of the pMTJ device 104 having a direction of magnetization (denoted by the direction of the arrow 154) that is parallel to a direction of magnetization (denoted by the direction of the arrow 156) in the fixed magnet 110. When the direction of magnetization 154 in the free magnet 106 is parallel to the direction of magnetization 156 in the fixed magnet 110, the pMTJ device 104 is said to be in a low resistance state.

In an embodiment, the free magnet 106 and the fixed magnet 110 can have approximately similar thicknesses. Injected spin polarized current that changes the direction of the magnetization 154 in the free magnet 106 can also affect the magnetization 156 of the fixed magnet 110. In an embodiment, to make the fixed magnet 110 more resistant to accidental flipping, the fixed magnet 110 has a higher magnetic anisotropy than the free magnet 106. In another embodiment, the spin orbit memory device 100 includes a synthetic antiferromagnetic (SAF) structure 112 above the fixed magnet 110 to deter accidental flipping of the magnetization 156 in the fixed magnet 110 as illustrated in FIG. 1A.

FIG. 1G illustrates cross-sectional view of the SAF structure 112 in accordance of an embodiment of the present invention. In an embodiment, the SAF structure 112 includes a non-magnetic layer 112B between a first pinning ferromagnet 112A and a second pinning ferromagnet 112C as depicted in FIG. 1D. The first pinning ferromagnet 112A and the second pinning ferromagnet 112C are anti-ferromagnetically coupled to each other. In an embodiment, the first pinning ferromagnet 112A includes a layer of a magnetic metal such as Co, Ni, Fe, alloys such as CoFe, CoFeB, or alloys of magnetic metals such as Co, Ni, Fe or a bilayer of a magnetic/non-magnetic metals such but not limited to Co/Pd or a Co/Pt. In an embodiment, the non-magnetic layer 112B includes a ruthenium or an iridium layer. In an embodiment, the pinning ferromagnet 112C includes a layer of a magnetic metal comprising Fe, Co or Ni. Exemplary alloys include CoFe or CoFeB. Other magnetic alloys of one or more of Co, Ni, Fe are also possible, as is a bilayer structure including a magnetic/non-magnetic metal such but not limited to Co/Pd or a Co/Pt. In an embodiment, a ruthenium based non-magnetic layer 112B has a thickness between 0.3 nm and 1.0 nm to ensure that the coupling between the pinning ferromagnet 112A and the pinning ferromagnet 112C is anti-ferromagnetic in nature.

An additional layer of non-magnetic spacer layer may be between the fixed magnet 110 and the SAF structure 112 (not illustrated in FIG. 1A), which may improve coupling between the SAF structure 112 and the fixed magnet 110. In an embodiment, the non-magnetic spacer layer may include a metal such as Ta, Ru or Ir.

Referring again to FIG. 1A, the top electrode 114 includes a material such as Ta or TiN. In an embodiment, the top electrode 114 has a thickness between 5 nm and 70 nm.

The spin orbit electrode 101 is coupled by a pair of conductive interconnects 116 and 118 in a dielectric material 102 above a substrate 120 to enable transmission of a charge current during operation of spin orbit memory device 100. In the illustrative embodiment, the conductive interconnect 116 is laterally separated from conductive interconnect 118. The pMTJ device 104 is laterally in between, but, on a plane above the conductive interconnects 116 and 118. In other embodiments, the spin orbit memory device 100 may include a single conductive interconnect such as conductive interconnect 116 or 118. In an embodiment, the conductive interconnects 116 and 118 each include a barrier layer, such as tantalum nitride, and a fill metal, such as copper, tungsten or ruthenium. In other embodiments, (not illustrated) the conductive interconnect 116 couples the spin orbit electrode 101 from below and the conductive interconnect 118 couples the spin orbit electrode 101 from above.

In an embodiment, the dielectric material 102 includes silicon and at least one of oxygen or nitrogen. In an embodiment, the substrate 120 includes a suitable semiconductor material such as but not limited to, single crystal silicon, polycrystalline silicon and silicon on insulator (SOI). In another embodiment, substrate 120 includes other semiconductor materials such as germanium, silicon germanium or a suitable group III-N or a group III-V compound. Logic devices such as MOSFET transistors and access transistors and may be formed on the substrate 120. Logic devices such as access transistors may be integrated with memory devices such as spin orbit memory device to form embedded memory. Embedded memory including spin orbit memory devices and a logic MOSFET transistors may be combined to form functional integrated circuit such as a system on chip. While the various embodiments here are illustrated with reference to a MTJ over a spin orbit coupling material, the embodiments are also applicable to spin valves. In a spin valve, a metal oxide or metal is formed between the two magnets 106 and 110 instead of the tunneling dielectric MgO.

Figure 2:
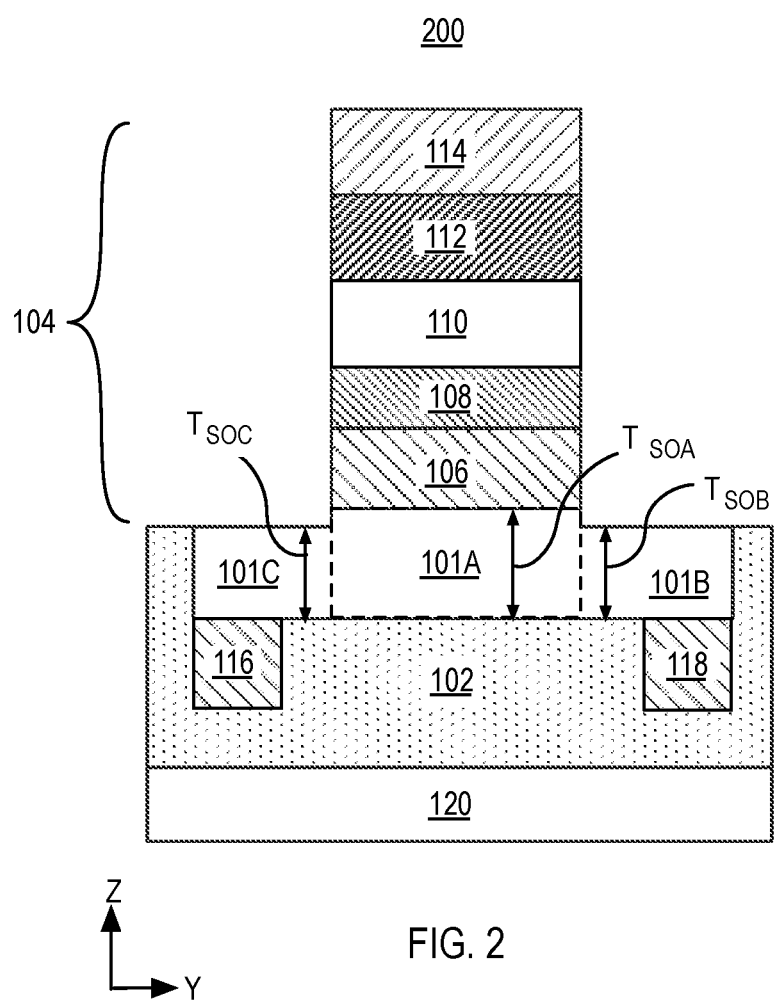
FIG. 2 illustrates a cross-sectional view of a spin orbit memory device where portions of a spin orbit electrode including a magnetic material and a metal have unequal thicknesses, in accordance with an embodiment of the present disclosure.

FIG. 2 illustrates a cross-sectional view of a spin orbit memory device 200 where portions of a spin orbit electrode 101 including a magnetic material and platinum have unequal thicknesses, in accordance with an embodiment of the present disclosure. As will be discussed below, unequal thicknesses across a lateral dimension (Y-axis) of the spin orbit electrode 101 is a feature that arises from a fabrication process.

As shown, a spin orbit electrode portion 101A under the pMTJ device 104 has a first thickness, $T_{SOA}$, and a spin orbit electrode portion 101B adjacent to the spin orbit electrode portion 101A has a second thickness, $T_{SOB}$ where the $T_{SOA}$ is greater than $T_{SOB}$. In an embodiment, the $T_{SOA}$ is between 1 nm and 3 nm greater than $T_{SOB}$. In an embodiment, $T_{SOA}$ is between 3 nm and 12 nm. In an embodiment, when $T_{SOA}$ is between 3 nm and 5 nm, $T_{SOA}$ is between 1 nm and 2 nm greater than $T_{SOB}$. In another embodiment, $T_{SOA}$ is at least 5 nm. In an embodiment, when $T_{SOA}$ is at least 5 nm, $T_{SOA}$ is between 1 nm and 3 nm greater than $T_{SOB}$.

In the illustrative embodiment, the spin orbit electrode 101 has a spin orbit electrode portion 101C adjacent to spin orbit electrode portion 101A, opposite to the spin orbit electrode portion 101B. In an exemplary embodiment, the spin orbit electrode portion 101C has a thickness, $T_{SOC}$ that is equal to or substantially equal to the thickness, $T_{SOB}$. In another embodiment, the spin orbit electrode portion 101C has a thickness, $T_{SOC}$, that is greater than a thickness, $T_{SOB}$. The spin orbit electrode portion 101C has a thickness, $T_{SOC}$, that may be less than a thickness, $T_{SOB}$, in other examples. Such variations in thickness between $T_{SOB}$ and $T_{SOC}$ may arise during patterning of the pMTJ device as will be discussed below.

It is to be appreciated that the unequal thickness in portions 101A, 101B and 101C of the spin orbit electrode 101 does not appreciably affect the performance of the spin orbit memory device. In an embodiment, when a difference in thickness between $T_{SOA}$ and $T_{SOB}$ or $T_{SOC}$ is approximately equal to or greater than the thickness $T_{SOB}$ or $T_{SOC}$, a charge current transmitted, along the Y-axis, in the spin orbit electrode 101 is not diminished enough to reduce a spin Hall current that is generated in spin orbit electrode portion 101A. In some such embodiments, $T_{SOB}$ or $T_{SOC}$ is at approximately 2 nm or more.

Figure 3A:
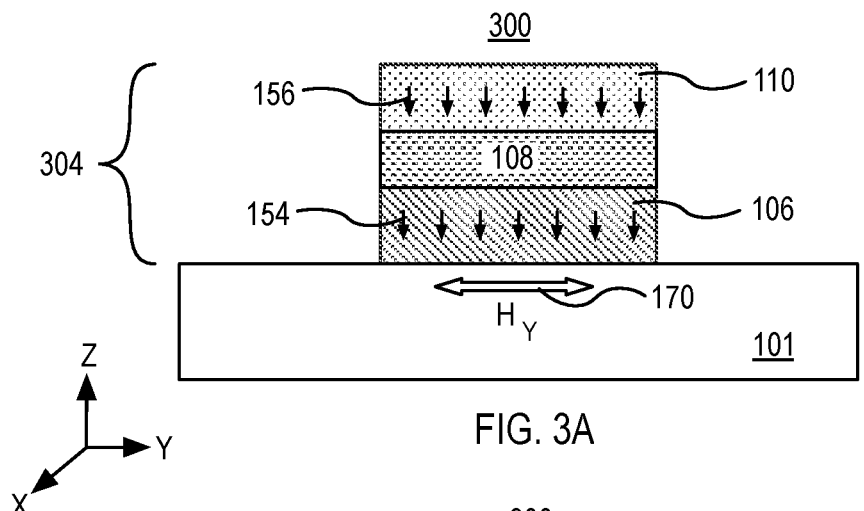
FIG. 3A illustrates a spin orbit memory device in a low resistance state.
Figure 3B:
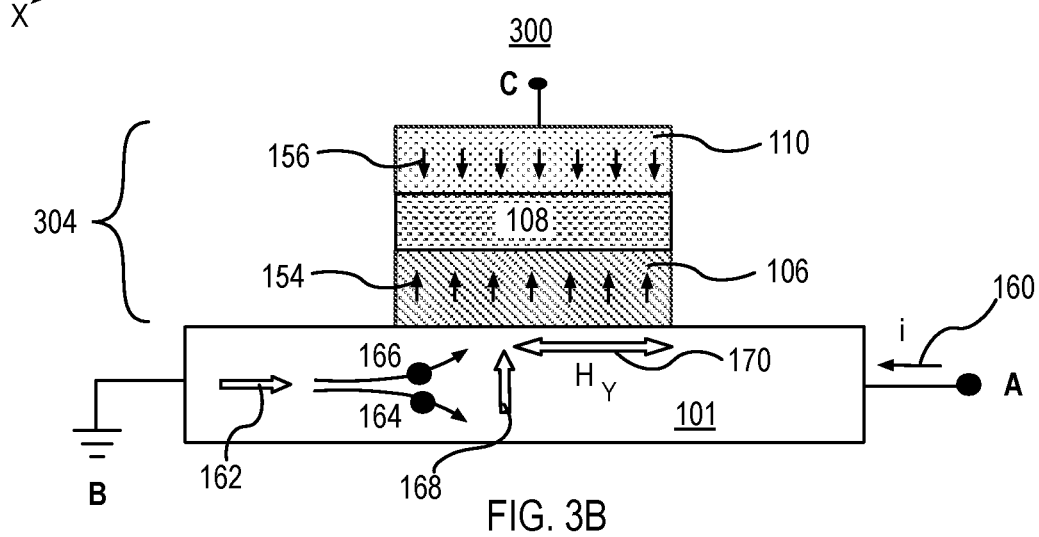
FIG. 3B illustrates a spin orbit memory device switched to a high resistance state after the application of a spin Hall current.
Figure 3C:
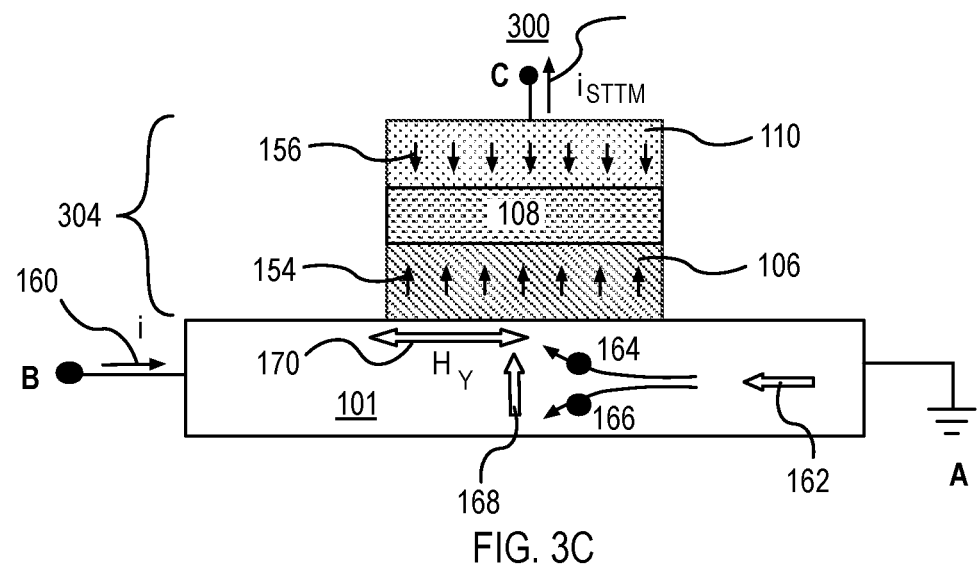
FIG. 3C illustrates a spin orbit memory device switched to a low resistance state after the application of a spin Hall current.

FIGS. 3A-3C illustrate a mechanism for switching a spin orbit memory device such as a spin orbit memory device 300 including a pMTJ device 304 on the electrode 101 including a spin orbit torque material. In the illustrative embodiment, the pMTJ device 304 includes one or more features of the pMTJ device 104 (FIG. 1A), such as the free magnet 106, the fixed magnet 110 and the tunnel barrier 108 between the free magnet 106, the fixed magnet 110.

FIG. 3A illustrates a spin orbit memory device 300 including the pMTJ device 304 on the electrode 101, where a magnetization 154 of the free magnet 106 is aligned in a direction parallel to the magnetization 156 of the fixed magnet 110. In an embodiment, the direction of magnetization 154 of the free magnet 106 and the direction of magnetization 156 of the fixed magnet 110 are both in the negative Z-direction as illustrated in FIG. 3A. As discussed above, when the magnetization 154 of the free magnet 106 is in the same direction as a magnetization 156 of the fixed magnet 110, pMTJ device 104 (FIG. 1A), is in a low resistance state.

FIG. 3B illustrates the pMTJ device 304 of the spin orbit memory device 300 switched to a high resistance state. In an embodiment, a reversal in the direction of magnetization 154 of the free magnet 106 in FIG. 3B relative to the direction of magnetization 154 of the free magnet 106 in FIG. 3A is brought about by (a) inducing a spin diffusion current 168 in the electrode 101 in the Y-direction, (by applying a positive voltage bias on terminal A with respect to a grounded terminal B), and (b) by an intrinsic magnetic field 170, $H_y$, from magnetization in the spin orbit electrode 101 along the Y axis.

In an embodiment, a charge current 160 is passed through the electrode 101 in the negative y-direction. In response to the charge current 160, an electron current 162 flows in the positive y-direction. The electron current 162 includes electrons with two opposing spin orientations, a type I electron 166, having a spin oriented in the negative x-direction and a type II electron 164 having a spin oriented in the positive X-direction. In an embodiment, electrons in the electron current 162 experience a spin dependent scattering phenomenon in the electrode 101. The spin dependent scattering phenomenon is brought about by a spin-orbit interaction between the nucleus of the atoms in the electrode 101 and the electrons in the electron current 162. The spin dependent scattering phenomenon causes type I electrons 166, whose spins are oriented in the negative x-direction (into the page of FIG. 3B), to be deflected upwards towards an uppermost portion of the electrode 101 and type II electrons 164 whose spins are oriented in the positive X-direction to be deflected downwards towards a lowermost portion of the electrode 101. The separation between the type I electrons 166 and the type II electrons 164 induces a polarized spin diffusion current 168 in the electrode 101. In an embodiment, the polarized spin diffusion current 168 is directed upwards toward the free magnet 106 of the pMTJ device 104, as is depicted in FIG. 3B. The polarized spin diffusion current 168 induces a spin Hall torque on the magnetization 154 of the free magnet 106. In an embodiment, a torque is also exerted on the magnetization 154 of the free magnet 106 by an intrinsic magnetic field, $H_y$, along the Y axis, as illustrated in FIG. 3B. In the illustrative embodiment, the intrinsic magnetic field, $H_y$, 170 provides a torque component (in the positive Z direction) to break symmetry and switch the magnetization 154 of the free magnet 106.

In a different embodiment, the torque due to the external magnetic field, $H_y$, can be supplemented by a torque from a spin torque transfer mechanism generated by passing a spin polarized current through the MTJ device 104 by voltage biasing terminal C. Terminal C may be biased relative to terminal B.

FIG. 3C illustrates the pMTJ device 304 of the spin orbit memory device 300 switched to a low resistance state. In an embodiment, a reversal in the direction of magnetization 154 of the free magnet 106 in FIG. 3C compared to the direction of magnetization 154 of the free magnet 106 in FIG. 3B is brought about by (a) reversal in the direction of the spin diffusion current 168 in the electrode 101 (by applying a positive voltage bias on terminal B with respect to a grounded terminal A), and (b) by an intrinsic magnetic field 170, $H_y$, from magnetization in the spin orbit electrode 101 along the Y axis.

A read operation to determine a state of the MTJ device 104 may be performed by voltage biasing a third terminal C, connected to the fixed magnet 110 with respect to the either terminal and A and B, where the terminals A or B may be grounded during the read operation (not illustrated).

Figure 4:
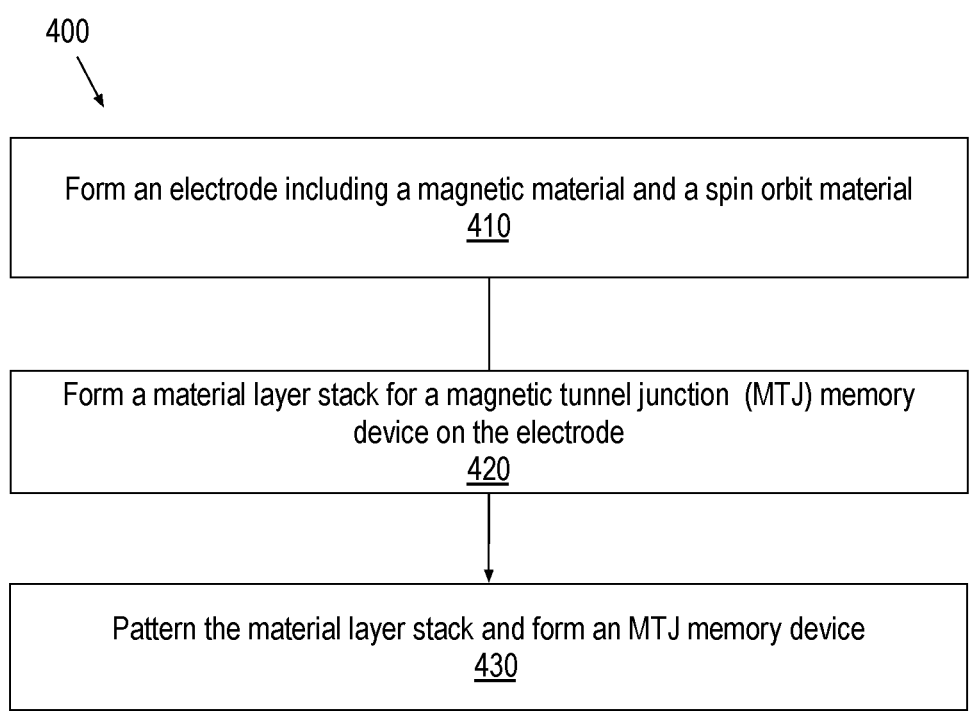
FIG. 4 illustrates a flow diagram for a method to fabricate a spin orbit memory device, in accordance with embodiments of the present disclosure.

FIG. 4 illustrates a flow diagram of a method to fabricate a spin orbit memory device such as a spin orbit memory device 100A. The method 400 begins at operation 410 by forming an electrode including a spin orbit material in a dielectric layer above a substrate. In exemplary embodiments, formation of the electrode includes depositing cobalt and/or iron in the presence of platinum. The method 400 continues at operation 420 with the formation of a material layer stack for the formation of an pMTJ device on the electrode. In exemplary embodiments, all layers in the material layer stack and the second spin orbit material are blanket deposited in-situ without breaking vacuum. In a simplest embodiment, forming the material layer stack includes a deposition of a free magnetic layer on the second spin orbit material, deposition of a tunnel barrier layer over the free magnetic layer, deposition of a fixed magnetic layer over the tunnel barrier layer. In an embodiment, the formation of the material layer stack further includes deposition of a plurality of layers of a synthetic antiferromagnetic (SAF) layer over the fixed magnetic layer, and deposition of a conductive material on the SAF layer. The method 400 concludes at operation 430 with patterning of the material layer stack to form an MTJ device on the electrode.

FIGS. 5A-5H illustrate cross-sectional views of the spin orbit memory device 100 illustrated in FIG. 1A evolving as a fabrication method, such as method 400, is practiced.

Figure 5A:
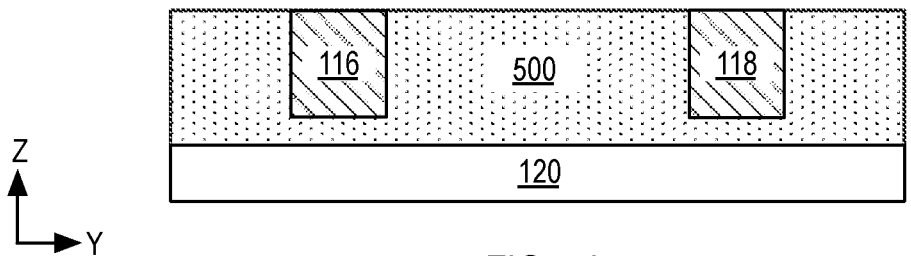
FIG. 5A illustrates a cross-sectional view following the formation of an electrode layer including a spin orbit material above a pair of conductive interconnects, in accordance with embodiments of the present disclosure.

FIG. 5A illustrates the structures of conductive interconnects 116 and 118 surrounded by a dielectric material 500 formed above a substrate 120. In an embodiment, the conductive interconnects 116 and 118 are formed in a dielectric material 500 by a damascene or a dual damascene process. In an embodiment, the conductive interconnect 118 includes a barrier layer, such as titanium nitride, ruthenium, tantalum, tantalum nitride, and a fill metal, such as copper, tungsten. In an embodiment, the conductive interconnects 116 and 118 are fabricated using a subtractive etch process when materials other than copper are utilized. In one such embodiment, the conductive interconnects 116 and 118 include a material such as but not limited to titanium nitride, ruthenium, tantalum, tantalum nitride. In some examples, the dielectric material 500 includes a material such as but not limited to silicon dioxide, silicon nitride, silicon carbide, or carbon doped silicon oxide. In an embodiment, the dielectric material 500 has an uppermost surface substantially co-planar with an uppermost surface of the conductive interconnects 116 and 118. The dielectric material 500 may include a material that is the same or substantially the same as the dielectric material 102 described above. Depending on embodiments, the dielectric material 500 has a total thickness between 70 nm-120 nm. In some examples, at least one of the conductive interconnects 116 or 118 is electrically connected to a circuit element such as an access transistor (not shown). Logic devices such as access transistors may be integrated with memory devices such as a spin orbit device to form embedded memory.

Figure 5B:
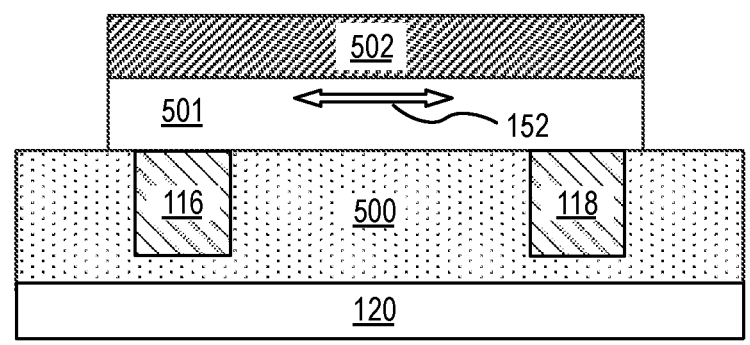
FIG. 5B illustrates a cross-sectional view of the structure in FIG. 5A following formation of a mask to pattern the electrode layer and following the patterning of the electrode layer to form an electrode including the spin orbit material.

FIG. 5B illustrates a cross-sectional view of the structure in FIG. 5A following the deposition of a layer 501 including a spin orbit coupling material such as platinum and one or more magnetic materials such as cobalt and/or iron (herein, SOC layer 501) on the conductive interconnects 116 and 118 and on the dielectric material 500. In an embodiment, the SOC layer 501 is blanket deposited using a physical vapor deposition (PVD) or a chemical vapor deposition (CVD) process. The PVD or CVD process may be controlled to tune the atomic percent of platinum in the SOC layer 501. The PVD deposition process is controlled to incorporate platinum uniformly into the magnetic material.

In some embodiments, the SOC layer 501 is deposited to a thickness that is between 5 nm and 20 nm. The as deposited thickness of the SOC layer 501 is greater than the final thickness of a spin orbit electrode to be formed as a fraction of the upper portion of the SOC layer 501 is removed during the fabrication process.

In an embodiment, the SOC layer 501 has fixed in-plane magnetization 152 along the Y-axis, after the deposition process. The in-plane magnetization 152 extends over the entire cross-sectional plane of the SOC layer 501. In other embodiments, the SOC layer 501 is annealed to form a SOC layer 501 having a uniform magnetization along the Y-axis. A direction of the in-plane magnetization 152 may be chosen during the anneal process.

In some embodiments, the mask 502 is formed by a lithographic process. In other embodiments, the mask 502 includes a dielectric material that has been patterned. The mask 502 defines a size of an electrode that will subsequently be formed.

Figure 5C:
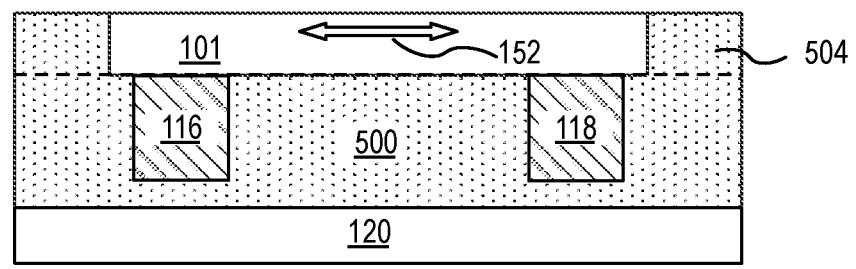
FIG. 5C illustrates a cross-sectional view of the structure in FIG. 5B following the deposition of a dielectric layer on the electrode and planarization of the dielectric layer and the mask.

FIG. 5C illustrates a cross-sectional view of the structure in FIG. 5B following the patterning of the SOC layer 501 to form a spin orbit electrode 101 and following the deposition of a dielectric material 504 and a planarization process. In an embodiment, the SOC layer 501 is patterned by a plasma etch process selectively to the mask 502. In other embodiments, the SOC layer 501 is patterned by an ion milling process selectively to the mask 502. In an embodiment, a dielectric material 504 is blanket deposited on the mask 502 and on the dielectric material 500. The dielectric material 504 may be formed by a PECVD deposition process. In some examples, the dielectric material 504 may include a material that is substantially the same as the material of the dielectric material 500. In some examples the PECVD deposition process may include a blanket deposition of the dielectric material 504.

A planarization process is carried out, for example, to remove the dielectric material 504 above the mask 502 and continued until almost all of the mask 502 is removed. The portions of the dielectric material 504 remains adjacent to the spin orbit electrode 101 after the planarization process. In an embodiment, the dielectric material 504 is further planarized until the mask 502 is removed. In one such embodiment, a top portion of the spin orbit electrode is also removed. The resulting spin orbit electrode 101 has a thickness between 3 nm and 12 nm.

While not shown, in some embodiments, metal layer 130 described in association with FIG. 1D may be deposited after patterning the SOC layer 501 but before deposition of a material layer stack 520.

Figure 5D:
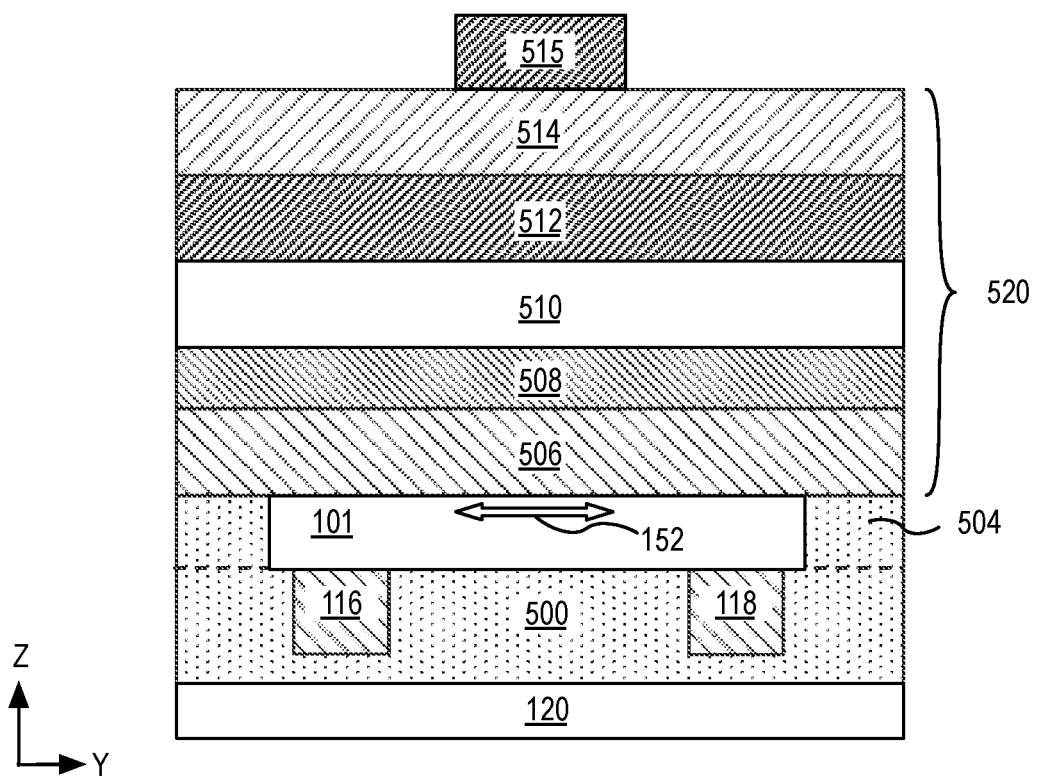
FIG. 5D illustrates a cross-sectional view of the structure in FIG. 5C following the formation of a material layer stack for a magnetic tunnel junction device on the spin orbit electrode and on the dielectric layer.

FIG. 5D illustrates a cross-sectional view of the structure in 5C following the formation of a material layer stack 520 to form a pMTJ device on the spin orbit electrode 101. In some embodiments, the free magnetic layer 506 is blanket deposited on the dielectric material 504, and on the spin orbit electrode 101. In an embodiment, free magnetic layer 506 includes a material that is the same or substantially the same as the material of the free magnet 106.

A tunnel barrier layer 508 is blanket deposited on the free magnetic layer 506. In an embodiment, the tunnel barrier layer 508 includes a magnesium and oxygen (for e.g. MgO) or aluminum and oxygen (for e.g. $Al_2O_3$). In an exemplary embodiment, the tunnel barrier layer 508 is an MgO and is deposited using a reactive sputter process. In an embodiment, the reactive sputter process is carried out at room temperature. In an embodiment, the tunnel barrier layer 508 is deposited to a thickness between 0.8 nm to 1 nm. In an embodiment, the deposition process is carried out in a manner that yields a tunnel barrier layer 508 having an amorphous structure. In some examples, the amorphous tunnel barrier layer 508 becomes crystalline after a high temperature anneal process to be described further below. In other embodiments, the tunnel barrier layer 508 is crystalline as deposited.

In an embodiment, the fixed magnetic layer 510 is blanket deposited on an uppermost surface of the tunnel barrier layer 508. In an embodiment, the deposition process includes a physical vapor deposition (PVD) or a plasma enhanced chemical vapor deposition process. In an embodiment, the PVD deposition process includes an RF or a DC sputtering process.

In an exemplary embodiment, the fixed magnetic layer 510 is $Co_{100-x-y}Fe_xB_y$, where X and Y each represent atomic percent, further where X is between 50 and 80 and Y is between 10 and 40, and further where the sum of X and Y is less than 100. In some embodiments, the fixed magnetic layer 510 includes a material that is the same or substantially the same as the material of the fixed magnet 110 described above. In some examples, the fixed magnetic layer 510 may be deposited to a thickness between 1.0 nm and 2.5 nm.

The process is continued with deposition of layers utilized to form a SAF structure 512. In some embodiments, the layers utilized to form SAF structure 512 are blanket deposited on the fixed magnetic layer 510 using a PVD process. The layers utilized to form SAF structure 512 are the same or substantially the same as the layers in the SAF structure 112 described above.

In some embodiments, the process utilized to deposit all layers of the material layer stack 520, illustrated in FIG. 5D, is carried without an air break. The individual layers may be blanket deposited using a variety of deposition processes in a cluster tool. Some layers may be deposited using a physical vapor deposition (PVD) process, for example. Other layers, for example, may be deposited by processes that may include a co-sputter or a reactive sputtering process. In the illustrative embodiment, formation of the SAF structure 512 includes blanket depositing a non-magnetic spacer layer (not shown) on the fixed magnetic layer 510. In some embodiments, the non-magnetic spacer layer includes a metal such as Ta, Ru or Ir.

In an embodiment, the deposition process concludes with a blanket deposition of a capping layer 514 on an uppermost surface of the SAF structure 512. The capping layer 514 may act as a hardmask during etching of the pMTJ material layer stack 520 to form a pMTJ device on the spin orbit electrode 101. For example, the capping layer 514 includes an etch resistant material such as a metal. In some embodiment, the metal includes Ta or TaN. In an embodiment, the thickness of the capping layer 514 is between 5 nm and 70 nm. The thickness of the capping layer 514 is chosen to accommodate patterning of the pMTJ material layer stack 520 to form a pMTJ device, as well as to act as a top electrode for voltage biasing the pMTJ device.

In an embodiment, after all the layers in the pMTJ material layer stack 520 are deposited, an anneal is performed. In an embodiment, the anneal is performed immediately post deposition but before patterning of the pMTJ material layer stack 520. A post-deposition anneal of the pMTJ material layer stack 520 is carried out in a furnace in a forming gas environment. In an embodiment, the forming gas includes a mixture of $H_2$ and $N_2$ gas. In an embodiment, the anneal temperature ranges between 300 and 350 degrees Celsius.

In an embodiment, the annealing process also promotes solid phase epitaxy of the free magnetic layer 506 to follow a crystalline template of the tunnel barrier layer 508 (e.g., MgO) that is directly above the free magnetic layer 506. In an embodiment, the anneal also promotes solid phase epitaxy of the fixed magnetic layer 510 to follow a crystalline template of the tunnel barrier layer 508 (e.g., MgO) that is directly below the fixed magnetic layer 510. <001> Lattice matching between the tunnel barrier layer 508 and the free magnetic layer 506 and <001> lattice matching between the tunnel barrier layer 508 and the fixed magnetic layer 510 enables a TMR ratio of at least 90% to be obtained in the pMTJ material layer stack 520.

In an embodiment, the annealing process is also performed in the presence of a magnetic field which sets a direction of magnetization of the fixed magnetic layer 510 and of the free magnetic layers 506 and 510. In an embodiment, during the annealing process, an applied magnetic field that is directed perpendicular (along the Z axis) to a horizontal plane (the Y axis) of pMTJ material layer stack 520 enables a perpendicular anisotropy to be set in the fixed magnetic layer 510, in the free magnetic layers 506 and 510.

A mask 515 may be formed after formation of the material layer stack 520. In some embodiments, the mask 515 is formed by a lithographic process. In other embodiments, the mask 515 includes a dielectric material that has been patterned. The mask 515 defines a shape and size of a pMTJ device and a location where the pMTJ device is to be subsequently formed with respect the spin orbit electrode 101. In some embodiments, the mask 515 has a circular shape as is depicted in the plan view illustration of FIG. 1B. In the illustrative embodiment, the mask 515 is formed on a plane above, but laterally between from the conductive interconnects 116 and 118. The mask 515 may be formed, approximately, midway between conductive interconnects 116 and 118, for example. A pMTJ device that is formed approximately, midway laterally between the conductive interconnects 116 and 118. In one such embodiment, during device operation, the charge current, to be laterally passed through the spin orbit electrode 101 between the conductive interconnects 116 and 118, may not adversely impact pMTJ switching.

Figure 5E:
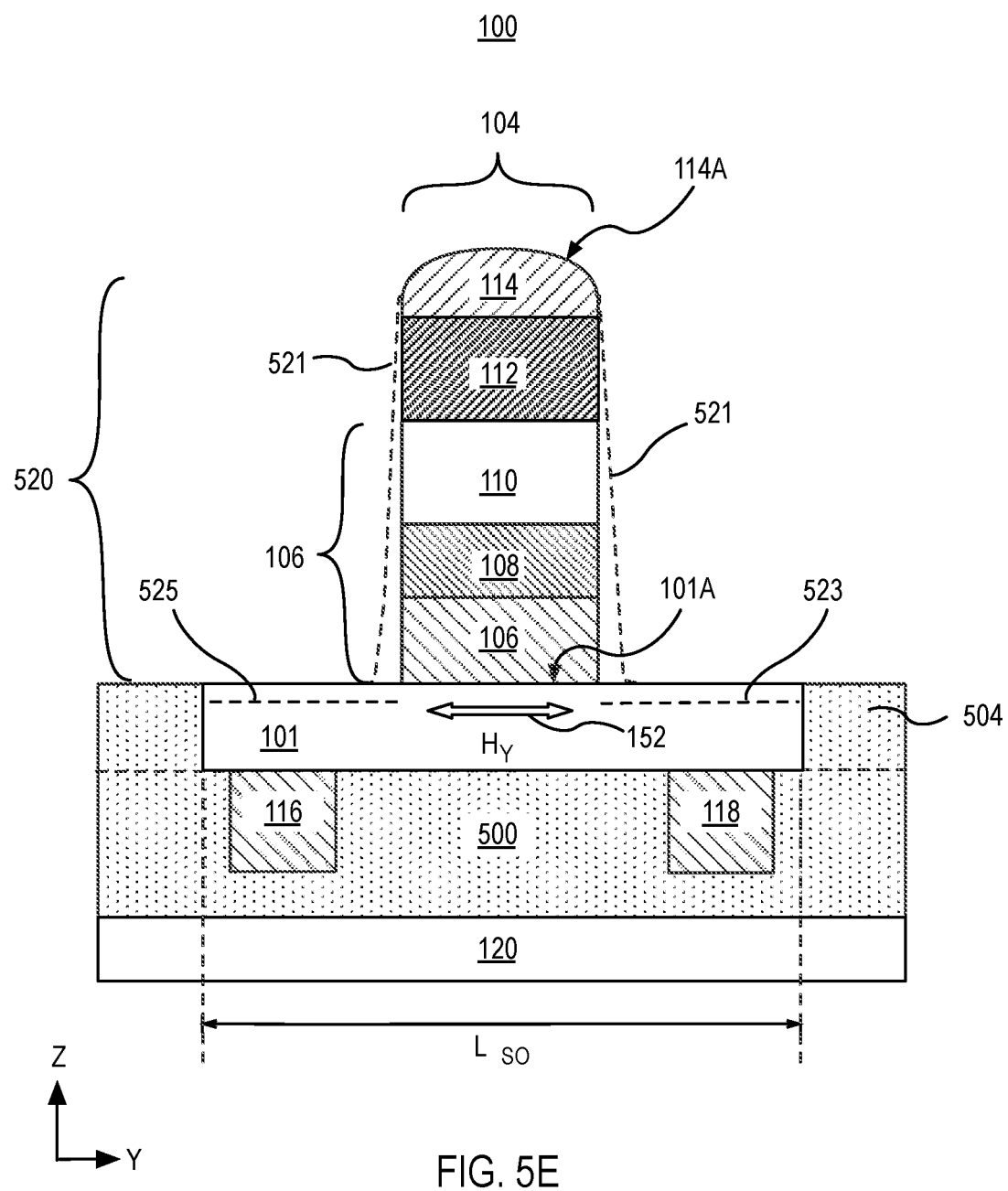
FIG. 5E illustrates a cross-sectional view of the structure in FIG. 5D following the process of etching the material layer stack to form a magnetic tunnel junction device on the electrode including the spin orbit material.

FIG. 5E illustrates a cross-sectional view of the structure in FIG. 5D following patterning and etching of the material layer stack 520. In an embodiment, the patterning process first includes etching the capping layer 514 by a plasma etch process to form a top electrode 114. In an embodiment, plasma etch process possesses sufficient ion energy and chemical reactivity to render vertical etched sidewalls of the top electrode 114. In an embodiment, the plasma etch process is then continued to pattern the remaining layers of the material layer stack 520 to form a pMTJ device 104. The plasma etch process etches the various layers in the material layer stack 520 to form a SAF structure 112, a fixed magnet 110, a tunnel barrier 108, a free magnet 106. The plasma etch process also exposes the spin orbit electrode 101 and the dielectric material 504. In the illustrative embodiment, the top electrode 114 has a curved top surface portion 114A.

In some embodiments, depending on the etch parameters, the pMTJ device 104 may have sidewalls that are tapered, as indicated by the dashed lines 521, during the etching process. The pMTJ device 104 formed over a spin orbit electrode 101 and coupled with conductive interconnects 116 and 118 constitutes the perpendicular spin orbit memory device 100, described in association with FIG. 1A.

In other embodiments, depending on the etch selectivity between the material of the free magnet 106 and the material of the spin orbit electrode 101, the spin orbit electrode 101 may be recessed below the spin orbit electrode surface 101A during patterning of the material layer stack 520. The recessed surfaces of the spin orbit electrode 101, not covered by the pMTJ device 104 is indicated by the dashed lines 523,525. The recess may be between 1 nm-3 nm.

Depending on a lateral dimension, $L_{SO}$, in some embodiments, the recess across the spin orbit electrode 101 may not be uniform. In some such embodiments, the dashed lines 523,525 may not be at a same level with respect to the spin orbit electrode surface 101A.

In embodiments, where a metal layer 130 described above in connection with FIG. 5C, is also formed between the SOC layer 501 and the material layer stack 520, the patterning process also etches the metal layer 130.

Figure 5F:
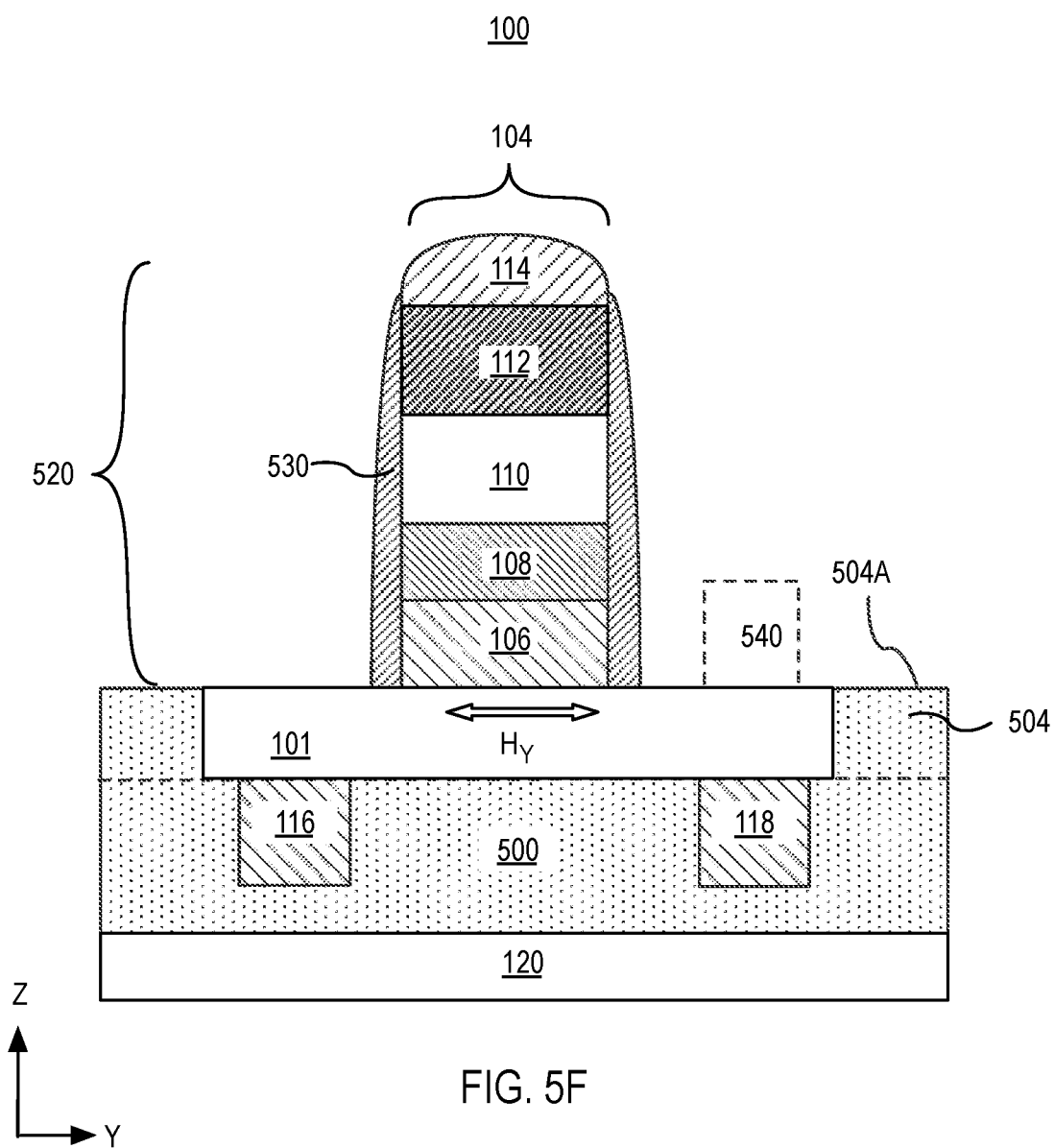
FIG. 5F illustrates a cross-sectional view of the structure in FIG. 5E following the formation of a dielectric spacer adjacent to the magnetic tunnel junction device and on portions of the electrode.

FIG. 5F illustrates a cross-sectional view of the structure in FIG. 5E following the formation of a dielectric spacer 530 adjacent to the pMTJ device 104. In an embodiment, a dielectric spacer layer is deposited on the pMTJ device 104 and on the uppermost surface of the spin orbit electrode 101 and on the dielectric material 504. In an embodiment, the dielectric spacer layer is deposited without a vacuum break following the plasma etch process utilized to form the pMTJ device 104. In other embodiments the spacer layer is blanket deposited by a PECVD deposition process. The dielectric spacer layer may also be deposited using a PVD or a PECVD deposition process. In some embodiments, the dielectric spacer layer includes a material such as, but not limited to, silicon nitride (e.g., comprising predominantly silicon and nitrogen), carbon doped silicon nitride (e.g., comprising predominantly silicon and nitrogen and a minor faction of carbon), or silicon carbide (e.g., comprising predominantly silicon and carbon). The dielectric spacer layer may include an insulator layer that does not have an oxygen content to minimize potential oxidation of magnetic layers. After blanket deposition dielectric spacer layer is etched by a plasma etch process to form the dielectric spacer 530 on sidewalls of the pMTJ device 104. In some examples, the etch process may cause an uppermost surface 504A of the dielectric material 504 to become partially recessed leading to partial exposure of sidewalls of the spin orbit electrode 101. Exposed sidewalls of the spin orbit electrode 101 may be covered with further dielectric material during subsequent processing operations.

In some embodiments, a dielectric spacer layer is deposited on pMTJ device of a spin orbit memory device such as spin orbit memory device 200, illustrated in FIG. 2.

In some embodiments, the spin orbit electrode 101 is formed on one of the conductive interconnects 116 or 118. In some such embodiments, the remaining one of the conductive interconnects 116 or 118 is fabricated at a later operation after the pMTJ 104 has been patterned. A location where the remaining one of the conductive interconnects 116 or 118 may be formed is depicted by a dashed box 540 in the cross-sectional illustration of FIG. 5G.

Figure 6:
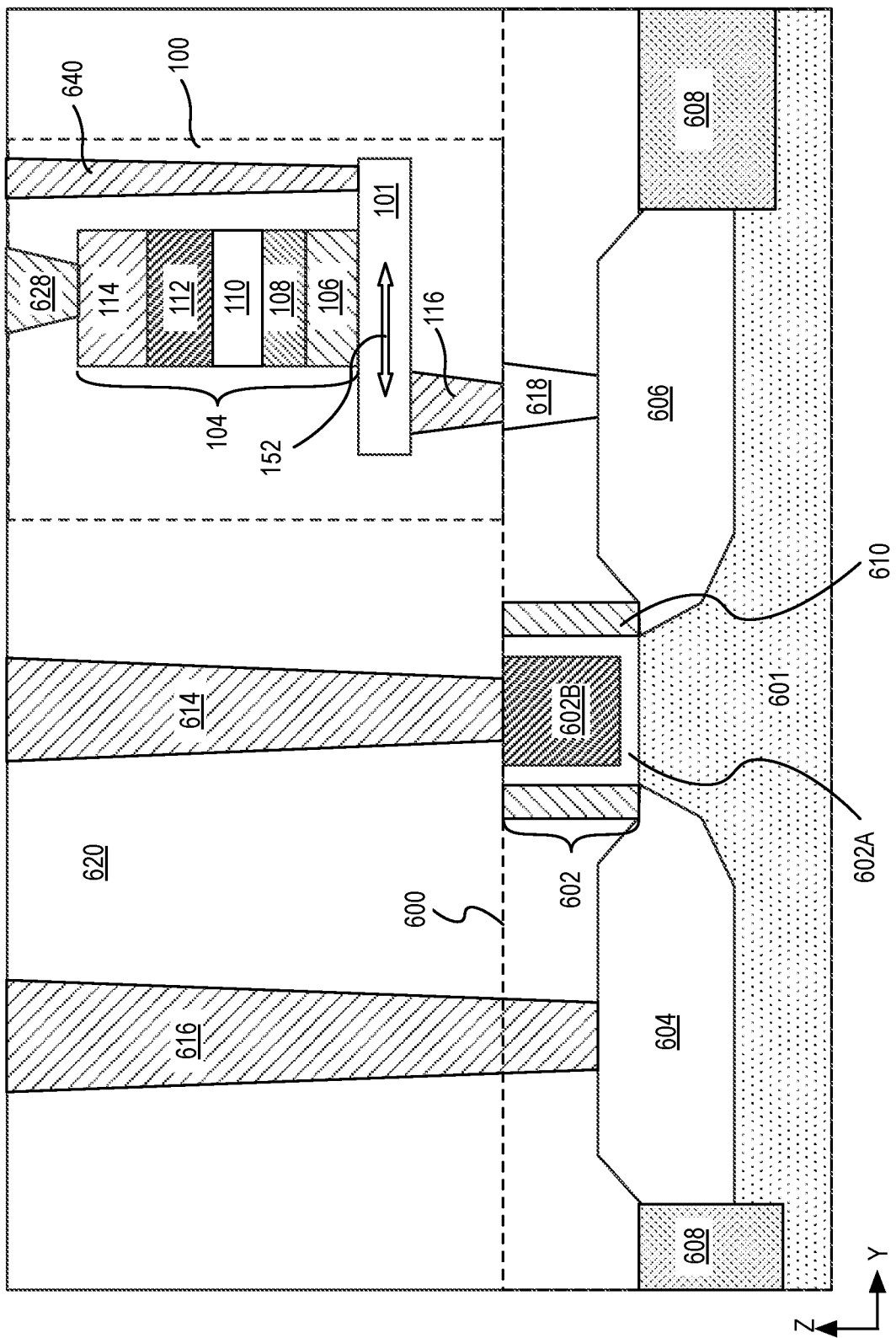
FIG. 6 illustrates a cross-sectional view of a spin orbit memory device coupled having one terminal coupled to a first transistor, a second terminal coupled to a second transistor, and a third terminal coupled to a bit line.

FIG. 6 illustrates a spin orbit memory device coupled to an access transistor 600. In an embodiment, the spin orbit memory device is a perpendicular spin orbit memory device 100. In an embodiment, the spin orbit memory device 100 includes a perpendicular MTJ device 104 on a spin orbit electrode such as a spin orbit electrode 101 including a magnetic material and platinum, described in association with FIGS. 1A, and 1D. The spin orbit memory device 100 may include one or more features of the spin orbit memory device 100 described above in embodiments, associated with FIGS. 1A-1G. In other embodiments, a perpendicular spin orbit memory device such as perpendicular spin orbit memory device 200 may be coupled with the transistor 600.

In an embodiment, the transistor 600 has a source region 604, a drain region 606 and a gate 602. The transistor 600 further includes a gate contact 614 above and electrically coupled to the gate 602, a source contact 616 above and electrically coupled to the source region 604, and a drain contact 618 above and electrically coupled to the drain region 606 as is illustrated in FIG. 6.

In the illustrative embodiment, the MTJ device 104 includes a first magnet having free magnetization such as a free magnet 106, a second magnet above the first electrode, the second magnet having a fixed magnetization, such as a fixed magnet 110, a layer such a tunnel barrier 108 between the first magnet and the second magnet, wherein the layer includes magnesium and oxygen and a second electrode such as a top electrode 114 above the fixed magnet 110. In the illustrative embodiment, the MTJ device 104 is a perpendicular MTJ device 104. In the illustrative embodiment, the pMTJ device 104 also includes a SAF structure 112 between the top electrode 114 and the fixed magnet 110.

In an embodiment, the perpendicular spin orbit memory device 100 is a three-terminal device. In one such embodiment, one portion of the spin orbit electrode 101 is in electrical contact with the drain contact 618 of transistor 600 and a second portion of the spin orbit electrode 101 is in contact with an interconnect metallization structure 640, such as is shown. In the illustrative embodiment, one portion of the spin orbit electrode 101 is in electrical contact with the drain contact 618 of transistor 600 through the conductive interconnect 116. The conductive interconnect 116 may be directly above the drain contact 618 as shown. A pMTJ contact 628 is on and electrically coupled with the top electrode 114 of the MTJ device 104. In the illustrative embodiment, the pMTJ device 104 is laterally between the drain contact 618 and the interconnect metallization structure 640. In some embodiments, the pMTJ device 104 is laterally closer to the drain contact 618 than to interconnect metallization structure 640. In other embodiments, the MTJ device 104 is laterally closer to the interconnect metallization structure 640 than to the drain contact 618. In some embodiments, the MTJ device 104 is approximately midway, laterally, between the interconnect metallization structure 640 and the drain contact 618.

While the perpendicular spin orbit memory device 100, as illustrated is coupled with a single transistor, the pMTJ contact 628 may be coupled with a component of a second transistor (such as a drain terminal—not shown) and the interconnect metallization structure 640 may be coupled with an external circuit element (not shown).

In an embodiment, the underlying substrate 601 represents a surface used to manufacture integrated circuits. Suitable substrate 601 includes a material such as single crystal silicon, polycrystalline silicon and silicon on insulator (SOI), as well as substrates formed of other semiconductor materials. In some embodiments, the substrate 601 is the same as or substantially the same as the substrate 120. The substrate 601 may also include semiconductor materials, metals, dielectrics, dopants, and other materials commonly found in semiconductor substrates.

In an embodiment, the transistor 600 associated with substrate 601 are metal-oxide-semiconductor field-effect transistors (MOSFET or simply MOS transistors), fabricated on the substrate 601. In some embodiments, the transistor 600 is an access transistor 600. In various implementations of the invention, the transistor 600 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 600 of substrate 601 includes a gate 602. In some embodiments, gate 602 includes at least two layers, a gate dielectric layer 602A and a gate electrode 602B. The gate dielectric layer 602A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 602A to improve its quality when a high-k material is used.

The gate electrode 602B of the access transistor 600 of substrate 601 is formed on the gate dielectric layer 602A and may consist of at least one P-type work function metal or N-type work function metal, depending on whether the transistor is to be a PMOS or an NMOS transistor. In some implementations, the gate electrode 602B may consist of a stack of two or more metal layers, where one or more metal layers are work function metal layers and at least one metal layer is a conductive fill layer.

For a PMOS transistor, metals that may be used for the gate electrode 602B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 602B may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode 602B may consist of one or more U-shaped metal layers formed atop one or more planar, non-U-shaped layers.

In some implementations of the invention, a pair of sidewall spacers 610 are on opposing sides of the gate 602. The sidewall spacers 610 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 604 and drain region 606 are formed within the substrate adjacent to the gate stack of each MOS transistor. The source region 604 and drain region 606 are generally formed using either an implantation/diffusion process or an etching/deposition process. In the former process, dopants such as boron, aluminum, antimony, phosphorous, or arsenic may be ion-implanted into the substrate to form the source region 604 and drain region 606. An annealing process that activates the dopants and causes them to diffuse further into the substrate typically follows the ion implantation process. In the latter process, the substrate 601 may first be etched to form recesses at the locations of the source and drain regions. An epitaxial deposition process may then be carried out to fill the recesses with material that is used to fabricate the source region 604 and drain region 606. In some implementations, the source region 604 and drain region 606 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 604 and drain region 606 may be formed using one or more alternate semiconductor materials such as germanium or a group III-V material or alloy. And in further embodiments, one or more layers of metal and/or metal alloys may be used to form the source region 604 and drain region 606. In the illustrative embodiment, an isolation 608 is adjacent to the source region 604, drain region 606 and portions of the substrate 601. In the illustrated embodiment, a dielectric layer 620 is adjacent to the gate contact 614, drain contact 618, source contact 616 and the spin orbit memory device 100.

In an embodiment, the source contact 616, the drain contact 618 and gate contact 614 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

The isolation 608 and dielectric layer 620 may include any material that has sufficient dielectric strength to provide electrical isolation such as, but not, limited silicon dioxide, silicon nitride, silicon oxynitride, carbon doped nitride and carbon doped oxide.

Figure 7:
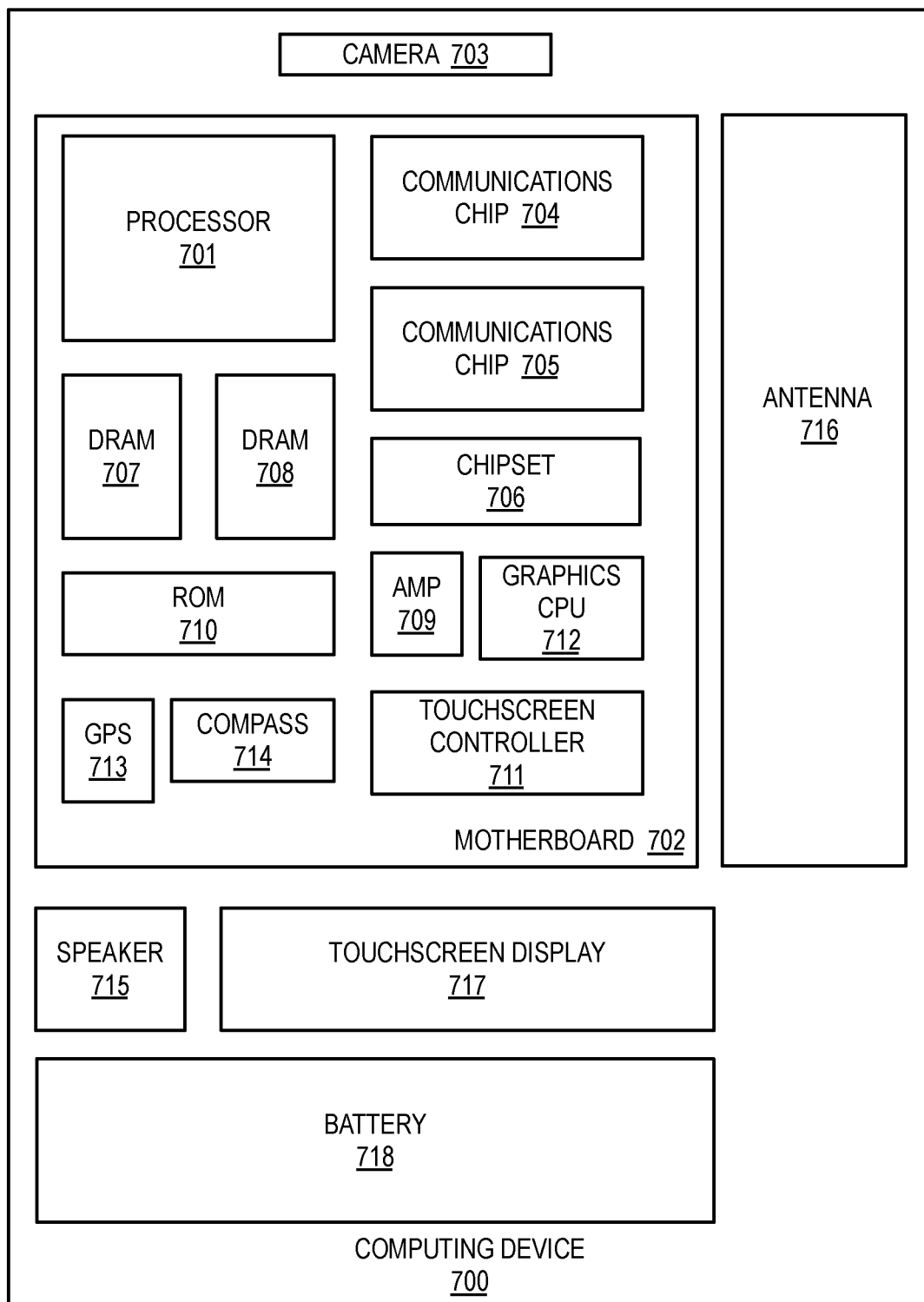
FIG. 7 illustrates a computing device in accordance with embodiments of the present disclosure.

FIG. 7 illustrates a computing device 700 in accordance with embodiments of the present disclosure. As shown, computing device 700 houses a motherboard 702. Motherboard 702 may include a number of components, including but not limited to a processor 701 and at least one communications chip 704 or 705. Processor 701 is physically and electrically coupled to the motherboard 702. In some implementations, communications chip 705 is also physically and electrically coupled to motherboard 702. In further implementations, communications chip 705 is part of processor 701.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset 706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 705 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 705 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communications chips 704 and 705. For instance, a first communications chip 705 may be dedicated to shorter range wireless communications such as Wi-Fi and Bluetooth and a second communications chip 704 may be dedicated to longer range wireless communications such as GPS, EDGE, GPRS, CDMA, WiMAX, LTE, Ev-DO, and others.

Processor 701 of the computing device 700 includes an integrated circuit die packaged within processor 701. In some embodiments, the integrated circuit die of processor 701 includes one or more memory devices, such as a spin orbit memory device 100 including a pMTJ device 104 in accordance with embodiments of the present disclosure. The term "processor" may refer to any device or portion of a device that processes electronic data from registers and/or memory to transform that electronic data into other electronic data that may be stored in registers and/or memory.

Communications chip 705 also includes an integrated circuit die packaged within communication chip 705. In another embodiment, the integrated circuit die of communications chips 704, 705 include a spin orbit memory device such as a spin orbit memory device 100 including a pMTJ device 104 on a spin orbit electrode 101 having a magnetic material and platinum.

Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics CPU 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 700 and discussed above may contain a stand-alone integrated circuit memory die that includes one or more arrays of memory cells including one or more memory devices, such as a spin orbit memory device 100, including a pMTJ device 104 on a spin orbit electrode 101 having a magnetic material and platinum, built in accordance with embodiments of the present disclosure.

In various implementations, the computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
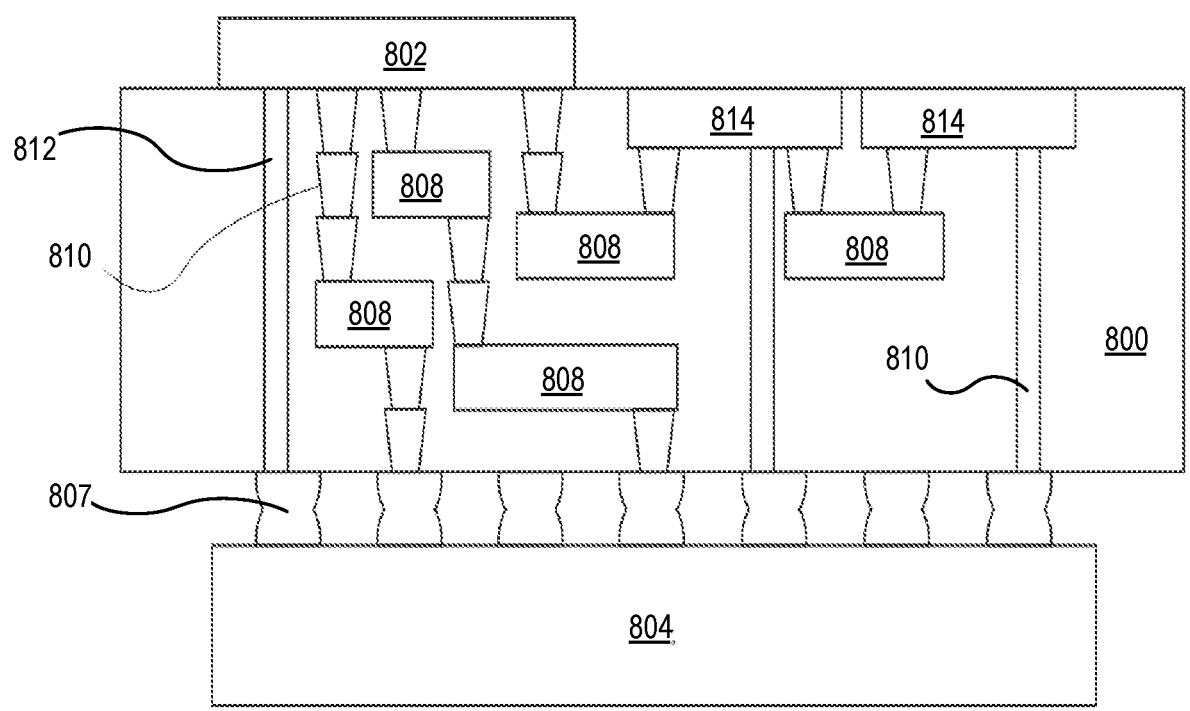
FIG. 8 illustrates an integrated circuit (IC) structure that includes one or more embodiments of the present disclosure.

FIG. 8 illustrates an integrated circuit (IC) structure 800 that includes one or more embodiments of the disclosure. The integrated circuit (IC) structure 800 is an intervening substrate used to bridge a first substrate 802 to a second substrate 804. The first substrate 802 may be, for instance, an integrated circuit die. The second substrate 804 may be, for instance, a memory module, a computer mother, or another integrated circuit die. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 807 that can subsequently be coupled to the second substrate 804. In some embodiments, the first and second substrates 802/804 are attached to opposing sides of the integrated circuit (IC) structure 800. In other embodiments, the first and second substrates 802/804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 808 and vias 810, including but not limited to through-silicon vias (TSVs) 812. The integrated circuit (IC) structure 800 may further include embedded devices 814, including both passive and active devices. Such devices include, but are not limited to, capacitors, decoupling capacitors, resistors, inductors, fuses, diodes, transformers, device structure including transistors, such as transistors 600 (described in FIG. 6) coupled with a with one at least one spin orbit memory device such as the spin orbit memory device 100. In one embodiment, the spin orbit memory device 100 (described in FIG. 6) includes a pMTJ device 104 on the spin orbit electrode 101 having a magnetic material and platinum. The integrated circuit (IC) structure 800 may further include embedded devices 814 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 800. In accordance with embodiments of the present disclosure, apparatuses or processes disclosed herein may be used in the fabrication of integrated circuit (IC) structure 800.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a spin orbit memory device such as the spin orbit memory device 100 including a spin orbit electrode 101 having a magnetic material and platinum. The spin orbit memory devices 100 may be used in an embedded non-volatile memory application.

Thus, embodiments of the present disclosure include spin orbit torque memory devices and methods of fabrication.

In a first example, a memory device, includes a first electrode having a magnetic material and platinum, where the magnetic material has a first magnetization and a material layer stack on a portion of the first electrode. The material layer stack includes a first magnet with a second magnetization, where the second magnetization is orthogonal to the first magnetization. The material layer stack further includes a second magnet with a third magnetization, a layer between the first magnet and the second magnet and a second electrode coupled with the second magnet. The second magnet is above the first magnet.

In second examples, for any of first examples, includes a layer between the spin orbit electrode and the first magnet, wherein the layer includes tungsten or molybdenum.

In third examples, for any of the first through second examples, the layer has a thickness between 0.2 nm and 1.0 nm.

In fourth examples, for any of the first through third examples, the first electrode includes at least 50% platinum.

In fifth examples, for any of the first through fourth examples, the magnetic material includes at least one of cobalt, or iron.

In sixth examples, for any of the first through fifth examples, the second and the third magnetizations are along a same plane of the memory device.

In seventh examples, the first through sixth examples electrode includes a first surface having first longitudinal dimension, and the lowermost surface of the first magnet includes a second surface having a second dimension along the first longitudinal dimension, where the first longitudinal dimension is at least three time greater than the second dimension.

In eighth examples, for any of the first example, for any of the first through seventh examples, the first electrode further includes a third dimension orthogonal to the first dimension, and the second surface of the first magnet includes a fourth dimension along the third dimension, where the fourth dimension is substantially the same as the third dimension.

In ninth examples, for any of the first through eighth examples, the first electrode has a thickness between 3 nm and 12 nm.

In tenth examples, for any of the first through ninth examples, the first electrode has a first portion under the material layer stack having a first thickness and a second portion laterally adjacent to the first portion having a second thickness, where the first thickness is greater than the second thickness.

In eleventh examples, first through tenth examples, the first thickness is between 1 nm and 3 nm greater than the second thickness.

In twelfth examples, for any of the first through eleventh examples, the first magnet and second magnet include at least one of cobalt, iron or boron.

In thirteenth examples, for any of the first through twelfth examples, further including a synthetic anti-ferromagnet (SAF) between the second layer and the second electrode, the SAF is anti-ferromagnetically coupled with the second magnet.

In a fourteenth example, for any of the first example, the second and third magnetization are orthogonal to each other.

In fifteenth example, an apparatus includes a first electrode having a magnetic material and a spin orbit material, where the magnetic material has a first magnetization and a material layer stack on a portion of the first electrode. The material layer stack includes a first magnet with a second magnetization, where the second magnetization is orthogonal to the first magnetization. The material layer stack further includes a second magnet with a third magnetization, a layer between the first magnet and the second magnet and a second electrode coupled with the second magnet. The second magnet is above the first magnet. The apparatus further includes a second layer between the first electrode and the first magnet, where the second layer includes tungsten or molybdenum.

In sixteenth examples, for any of the fifteenth example, the second layer has a thickness between 0.2 nm and 1.0 nm.

In seventeenth examples, for any of the fifteenth through sixteenth examples, the first electrode includes at least 50% platinum.

In eighteenth examples, for any of the fifteenth through seventeenth examples, the second and the third magnetizations are along a same plane of the apparatus, and the first electrode has a thickness between 3 nm and 12 nm.

In a nineteenth example, a system includes a processor having at least a transistor above a substrate. The transistor includes a gate contact coupled to a gate, a drain contact coupled to a drain and a source contact coupled to a source, where the gate is between the source and the drain. The system further includes a perpendicular spin orbit memory device coupled with the drain contact. The perpendicular spin orbit memory device includes a first electrode where the first electrode includes a magnetic material and platinum, where the magnetic material has a first magnetization, and a material layer stack on a portion of the first electrode. The material layer stack includes a first magnet with a second magnetization, where the second magnetization is orthogonal to the first magnetization. The material layer stack further includes a second magnet with a third magnetization, a layer between the first magnet and the second magnet and a second electrode coupled with the second magnet. The second magnet is above the first magnet. The perpendicular spin orbit memory device further includes a conductive interconnect coupled to the first electrode, where the conductive interconnect is laterally distant from the drain contact.

In twentieth examples, for any of the nineteenth example, the system further includes a battery coupled to power the processor comprising the perpendicular spin orbit memory device.

What is claimed is:

1. A memory device, comprising:
   a spin orbit electrode having an electron current direction, the spin orbit electrode comprising a magnetic material and platinum, wherein the magnetic material is intrinsically ferromagnetic and has an in-plane magnetization along the electron current direction; and
   a material layer stack on the spin orbit electrode, the material layer stack comprising:
      a first magnet on and in direct contact with the spin orbit electrode, the first magnet comprising a first magnetization, wherein the first magnetization is orthogonal to the in-plane magnetization;
      a second magnet with a second magnetization, the second magnet above the first magnet;
      a layer between the first magnet and the second magnet; and
      an electrode coupled with the second magnet.

2. The memory device of claim 1, wherein the spin orbit electrode comprises at least 50% platinum.

3. The memory device of claim 1, wherein the magnetic material comprises at least one of cobalt, or iron.

4. The memory device of claim 1, wherein the first and the second magnetizations are along a same plane of the memory device.

5. The memory device of claim 1, wherein the first and the second magnetizations are orthogonal to each other.

6. The memory device of claim 1, wherein the spin orbit electrode comprises a first surface having a first longitudinal dimension, and the lowermost surface of the first magnet comprises a second surface having a second dimension along the first longitudinal dimension, wherein the first longitudinal dimension is at least three time greater than the second dimension, and wherein the in-plane magnetization is an in-plane magnetization with respect to the first surface and with respect to the second surface and wherein the first magnetization is orthogonal with respect to the second surface.

7. The memory device of claim 6, wherein the spin orbit electrode further comprises a third dimension orthogonal to the first dimension, and the second surface of the first magnet comprises a fourth dimension along the third dimension, wherein the fourth dimension is substantially the same as the third dimension.

8. The memory device of claim 1, wherein the spin orbit electrode has a thickness between 3 nm and 12 nm.

9. The memory device of claim 1, wherein the spin orbit electrode has a first portion under the material layer stack having a first thickness and a second portion laterally adjacent to the first portion having a second thickness, where the first thickness is greater than the second thickness.

10. The memory device of claim 9, wherein the first thickness is between 1 nm and 3 nm greater than the second thickness.

11. The memory device of claim 1, wherein the first magnet and second magnet comprise at least one of cobalt, iron or boron.

12. The memory device of claim 1 further comprises a synthetic anti-ferromagnet (SAF) between the second magnet and the electrode, wherein the SAF is anti-ferromagnetically coupled with the second magnet.

13. An apparatus comprising:
 a first electrode, comprising:
  a magnetic material and platinum, wherein the magnetic material is intrinsically ferromagnetic and has an in-plane magnetization along an electron current direction; and
 a material layer stack on at least a portion of the first electrode, the material layer stack comprising:
  a first magnet with first magnetization on and indirect contact with the portion of the first electrode, wherein the first magnetization is orthogonal to the in-plane magnetization;
  a second magnet with a second magnetization, the second magnet above the first magnet;
  a first layer between the first magnet and the second magnet; and
  second electrode coupled with the second magnet.

14. The apparatus of claim 13, wherein the first electrode comprises at least 50% platinum.

15. The apparatus of claim 13, wherein the first and the second magnetizations are along a same plane of the apparatus, and wherein the first electrode has a thickness between 3 nm and 12 nm.

16. A system comprising:
 a processor comprising at least a transistor above a substrate, the transistor comprising:
  a drain contact coupled to a drain;
  a source contact coupled to a source; and
  a gate contact coupled to a gate; and
 a perpendicular spin orbit memory device coupled with the drain contact, the perpendicular spin orbit memory device comprising:
  a first electrode comprising a magnetic material and platinum, wherein the magnetic material is intrinsically ferromagnetic and has an in-plane magnetization along an electron current direction; and
  a material layer stack on the first electrode, the material layer stack comprising:
   a first magnet on and in direct contact with the spin orbit electrode, the first magnet comprising a first magnetization, wherein the first magnetization is orthogonal to the in-plane magnetization;
   a second magnet with a second magnetization, the second magnet above the first magnet;
   a layer between the first magnet and the second magnet;
   an electrode coupled with the second magnet; and
   a conductive interconnect coupled to the first electrode, wherein the conductive interconnect is laterally distant from the drain contact.

17. The system of claim 16, further comprises a battery coupled to power the processor comprising the perpendicular spin orbit memory device.

* * * * *